United States Patent
Lee et al.

(10) Patent No.: US 10,734,059 B2
(45) Date of Patent: *Aug. 4, 2020

(54) SEMICONDUCTOR DEVICE HAVING INTERCONNECTION IN PACKAGE AND METHOD FOR MANUFACTURING THE SAME

(71) Applicant: Samsung Electronics Co., Ltd., Suwon-si (KR)

(72) Inventors: Jaehyung Lee, Hwaseong-si (KR); JungSik Kim, Seoul (KR); Youngdae Lee, Yongin-si (KR); Duyeul Kim, Hwaseong-si (KR); Sungmin Yim, Suwon-si (KR); Kwangil Park, Yongin-si (KR); Chulsung Park, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/674,554

(22) Filed: Nov. 5, 2019

(65) Prior Publication Data

US 2020/0066323 A1 Feb. 27, 2020

Related U.S. Application Data

(63) Continuation of application No. 16/527,415, filed on Jul. 31, 2019, which is a continuation of application
(Continued)

(30) Foreign Application Priority Data

Jul. 9, 2014 (KR) .......................... 10-2014-0086185

(51) Int. Cl.
*G11C 11/4072* (2006.01)
*G11C 29/50* (2006.01)
(Continued)

(52) U.S. Cl.
CPC ............ *G11C 11/4072* (2013.01); *G11C 5/04* (2013.01); *G11C 11/408* (2013.01);
(Continued)

(58) Field of Classification Search
CPC ....... G11C 5/04; G11C 7/1063; G11C 7/1075; G11C 7/109; G11C 11/4072;
(Continued)

(56) References Cited

U.S. PATENT DOCUMENTS 5,854,769 A * 12/1998 Lee .......................... G11C 8/06
365/230.02
5,943,283 A * 8/1999 Wong .................. G06F 12/1408
365/221
(Continued)

FOREIGN PATENT DOCUMENTS

JP 2012-253485 12/2012
KR 10-1995-0002001 A 1/1995
(Continued)

*Primary Examiner* — J. H. Hur
*Assistant Examiner* — R Lance Reidlinger
(74) *Attorney, Agent, or Firm* — Muir Patent Law, PLLC

(57) ABSTRACT

A semiconductor device includes a first die connected to a first channel, the first die comprising a first memory chip; and a second die connected to a second channel, the second die comprising a second memory chip, the first and second channels being independent of each other and a storage capacity and a physical size of the second die being the same as those of the first die. The first and second dies are disposed in one package, and the package includes an interconnection circuit disposed between the first die and the
(Continued)

second die to transfer signals between the first memory chip and the second memory chip.

20 Claims, 18 Drawing Sheets

Related U.S. Application Data

No. 15/640,854, filed on Jul. 3, 2017, now Pat. No. 10,418,087, which is a continuation of application No. 14/697,634, filed on Apr. 28, 2015, now Pat. No. 9,805,769.

(51) Int. Cl.
| | |
|---|---|
| *G11C 11/408* | (2006.01) |
| *G11C 11/409* | (2006.01) |
| *H01L 23/498* | (2006.01) |
| *G11C 5/04* | (2006.01) |
| *G11C 29/02* | (2006.01) |
| *H01L 25/065* | (2006.01) |
| *G11C 7/10* | (2006.01) |

(52) U.S. Cl.
CPC ......... *G11C 11/409* (2013.01); *G11C 29/022* (2013.01); *G11C 29/028* (2013.01); *G11C 29/50008* (2013.01); *H01L 23/49838* (2013.01); *H01L 25/0655* (2013.01); *G11C 7/109* (2013.01); *G11C 7/1063* (2013.01); *G11C 7/1075* (2013.01); *H01L 2924/0002* (2013.01)

(58) Field of Classification Search
CPC ... G11C 11/408; G11C 29/022; G11C 29/028; G11C 29/50008; H01L 23/49838; H01L 25/0655; H01L 2924/0002
See application file for complete search history.

(56) References Cited

U.S. PATENT DOCUMENTS

| | | | |
|---|---|---|---|
| 6,038,637 A * | 3/2000 | Berube | G11C 8/00 365/189.05 |
| 6,114,885 A | 9/2000 | Yang et al. | |
| 6,188,237 B1 | 2/2001 | Suzuki et al. | |
| 6,281,578 B1 | 8/2001 | Lo et al. | |
| 6,414,904 B2 | 7/2002 | So et al. | |
| 6,617,700 B2 | 9/2003 | Lee et al. | |
| 6,943,454 B1 | 9/2005 | Gulachenski et al. | |
| 6,947,336 B2 | 9/2005 | Kim et al. | |
| 7,034,382 B2 | 4/2006 | Palmteer et al. | |
| 7,068,064 B1 * | 6/2006 | Yen | G06F 13/4086 326/30 |
| 7,123,497 B2 | 10/2006 | Matsui et al. | |
| 7,269,043 B2 | 9/2007 | Lee | |
| 7,624,310 B2 | 11/2009 | Porterfield | |
| 7,894,230 B2 | 2/2011 | Kim | |
| 7,990,174 B2 | 8/2011 | Park | |
| 7,994,813 B2 | 8/2011 | Sohn et al. | |
| 8,031,539 B2 | 10/2011 | Gregorius | |
| 8,202,764 B2 | 6/2012 | Jeong | |
| 8,344,752 B2 | 1/2013 | Song | |
| 8,433,874 B2 | 4/2013 | Oh et al. | |
| 9,209,160 B2 | 12/2015 | Lee | |
| 9,466,593 B2 | 10/2016 | Lee et al. | |
| 2002/0031856 A1 | 3/2002 | Lee et al. | |
| 2008/0068917 A1 * | 3/2008 | Djordevic | G11C 5/04 365/230.01 |
| 2009/0008799 A1 | 1/2009 | Lee et al. | |
| 2010/0146540 A1 | 7/2010 | Kwean | |
| 2011/0193086 A1 | 8/2011 | Lee et al. | |
| 2012/0137040 A1 | 5/2012 | Kim et al. | |
| 2012/0269489 A1 | 10/2012 | Park et al. | |
| 2013/0043584 A1 | 2/2013 | Kwon et al. | |
| 2013/0049223 A1 | 2/2013 | Nomoto et al. | |
| 2013/0093492 A1 | 4/2013 | Riho | |
| 2013/0208524 A1 | 8/2013 | Sung et al. | |
| 2013/0320557 A1 | 12/2013 | Lai | |
| 2014/0011300 A1 | 1/2014 | Kim | |
| 2014/0192583 A1 * | 7/2014 | Rajan | G11C 7/10 365/63 |

FOREIGN PATENT DOCUMENTS

| | | |
|---|---|---|
| KR | 10-1995-0004479 A | 2/1995 |
| KR | 10-0163863 B1 | 9/1998 |
| KR | 10-0336481 B1 | 5/2002 |
| KR | 10-1352814 B1 | 1/2004 |
| KR | 10-2006-0005713 A | 1/2006 |

* cited by examiner

SEMICONDUCTOR DEVICE HAVING INTERCONNECTION IN PACKAGE AND METHOD FOR MANUFACTURING THE SAME

CROSS-REFERENCE TO RELATED APPLICATIONS

This application claims priority to and is a continuation application of U.S. patent application Ser. No. 16/527,415, filed Jul. 31, 2019, which is a continuation application of U.S. patent application Ser. No. 15/640,854, filed Jul. 3, 2017, which is a continuation application of U.S. patent application Ser. No. 14/697,634, filed Apr. 28, 2015, which claims priority under 35 U.S.C. § 119 to Korean Patent Application No. 10-2014-0086185 filed Jul. 9, 2014, in the Korean Intellectual Property Office, the entire contents of each of which are hereby incorporated by reference.

BACKGROUND

The embodiments described herein relate to a semiconductor device, and more particularly, relate to a semiconductor device accessed in package using an independent channel.

A processing system may contain a multi-channel memory device that independently operate in one package through different channels.

A multi-channel semiconductor device formed of a volatile memory (e.g., DRAM) is typically integrated on one die (or, chip) and is then contained in one package. The multi-channel semiconductor device is connected to a corresponding processor and independently conducts data reading and writing operations through respective channels.

When the multi-channel semiconductor device is implemented on a mono die (e.g., a single, integrated die), the size of the die markedly increases due to two or more channels formed on the mono die, thereby lowering density and availability on edge dies. As such, production cost may increase due to a decrease in yield.

SUMMARY

According to certain aspects of the disclosed embodiments, a semiconductor device includes a first die connected to a first channel, the first die comprising a first memory chip; and a second die connected to a second channel, the second die comprising a second memory chip, the first and second channels being independent of each other and a storage capacity and a physical size of the second die being the same as those of the first die. The first and second dies are disposed in one package, and the package includes an interconnection circuit disposed between the first die and the second die to transfer signals between the first memory chip and the second memory chip.

In one embodiment, the first channel is a channel dedicated to the first memory chip for receiving a first type of signal from outside the semiconductor device, the second channel is a channel dedicated to the second memory chip for receiving the first type of signal from outside the semiconductor device, and the interconnection circuit comprises a common channel shared by the first and second memory chips for receiving a second type of signal different from the first type of signal at one of the first and second memory chips and applying the second type of signal to both the first memory chip and the second memory chip.

In one embodiment, the first type of signal is an address, data, or command signal, the second type of signal is an operational control signal that includes one of an impedance calibration signal and a reset signal.

The package may include a package substrate on which the first die and second die are mounted, and the first die and second die may be mounted to be at a same vertical level above the package substrate.

In one embodiment, the interconnection circuit is included within the package substrate.

In one embodiment, the first and second dies are disposed to have a space therebetween, and at least a part of the interconnection circuit is formed between the first and second dies.

In one embodiment, the first and second dies are positioned to have side edges that are aligned with each other.

In one embodiment, the first and second dies are disposed in the package and are arranged in a mirror die configuration.

In one embodiment, the first and second dies are disposed in the package and are arranged in a rotated die configuration.

In one embodiment, the first die includes a first swapping circuit configured to change a signal order of signals received at die pads of the first die in response to a swapping enable signal.

In one embodiment, the second die includes a second swapping circuit configured to change a signal order of signals received at die pads of the second die in response to the swapping enable signal.

In one embodiment, the second swapping circuit is enabled in response to the swapping enable signal when the first swapping circuit is disabled.

In one embodiment, the semiconductor device further includes a third die connected to a third channel, the third die comprising a third memory chip, and a fourth die connected to a fourth channel, the fourth die comprising a fourth memory chip, the third and fourth channels being independent of each other and a storage capacity and a physical size of the fourth die being the same as those of the third die The first to fourth dies may be disposed in the one package. The package may include an additional interconnection part disposed between the third die and the fourth die to transfer signals between the third memory chip and the fourth memory chip.

In one embodiment, the first and second dies conduct the same memory operations as a 2-channel mono die DRAM having a size of the combined first and second dies.

According to some aspects of the disclosed embodiments, a semiconductor device includes: a first die connected to a first channel through which an address, a command, and data are received; and a second die connected to a second channel independent of the first channel through which an address, a command, and data are received. A data storage capacity and a physical size of the second die are the same as those of the first die. The first and second dies are disposed on a package substrate as part of a package, and are horizontally spaced apart from each other to include a space therebetween. The package includes an interconnection circuit disposed between the first die and the second die to transfer a common signal, associated with a memory operation, between the first die and the second die.

In one embodiment, the semiconductor device has the same memory operation as a DDR DRAM with a 2-channel mono die configuration.

In one embodiment, the common signal is a reset signal or an impedance calibration signal.

In one embodiment, the first channel is a channel dedicated to the first die for receiving the address, command, and data from outside the semiconductor device; the second channel is a channel dedicated to the second die for receiving the address, command, and data from outside the semiconductor device; and the common signal is a signal used by both the first die and the second die.

According to certain aspects of the disclosed embodiments, a semiconductor device includes: a package substrate; a first semiconductor memory chip on the substrate; a second semiconductor memory chip on the substrate and horizontally separated from the first semiconductor memory chip so that a space is formed between a first edge of the first semiconductor memory chip and a first edge of the second semiconductor chip; a first set of pads on the first semiconductor chip connected to a first channel dedicated to the first semiconductor chip; a second set of pads on the second semiconductor chip connected to a second channel dedicated to the second semiconductor chip; a third set of pads on the first semiconductor chip connected to an interconnection circuit on the package substrate; and a fourth set of pads on the second semiconductor chip connected to the interconnection circuit. The interconnection circuit transfers certain signals received from and processed at the first semiconductor chip to the second semiconductor chip.

In one embodiment, the first semiconductor chip receives a first type of signal over the first channel; the second semiconductor chip receives the first type of signal over the second channel; and the certain signals transferred by the interconnection circuit are second type of signal different from the first type of signal.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
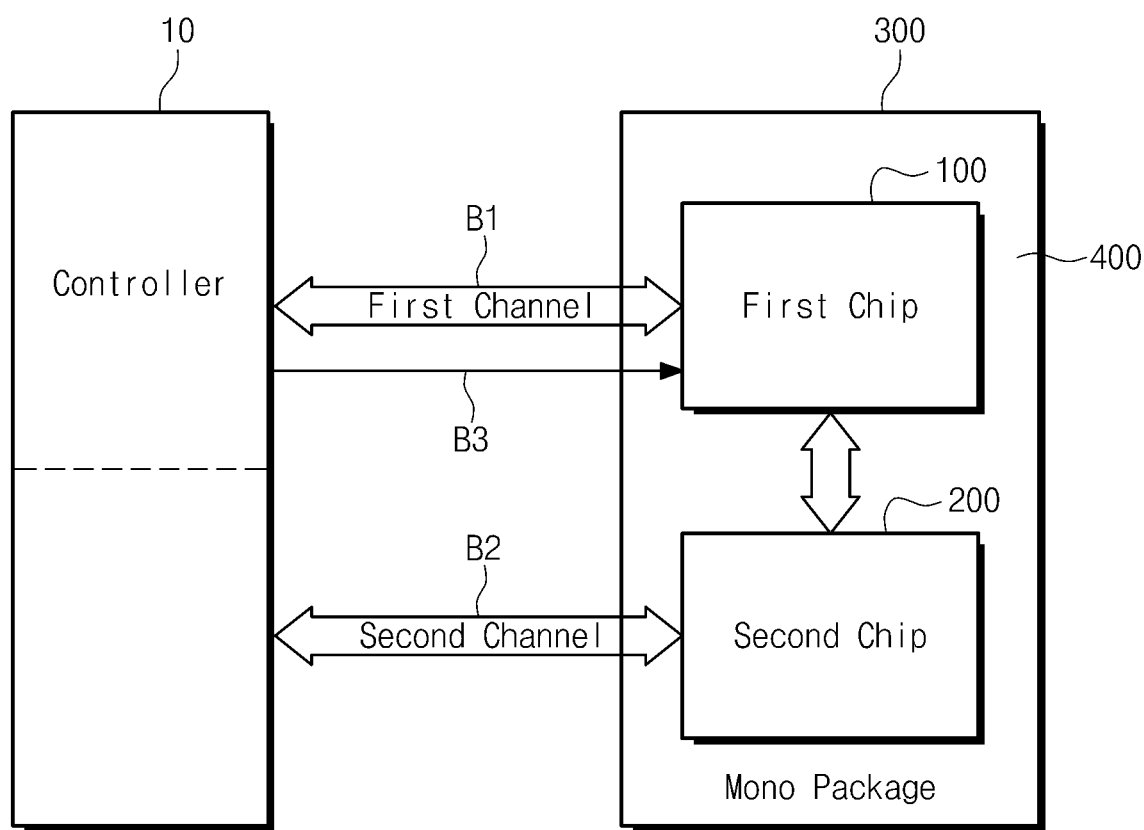
FIG. 1 is a block diagram of a memory system according to an embodiment of the inventive concept.

Embodiments will be described in detail with reference to the accompanying drawings. The inventive concept, however, may be embodied in various different forms, and should not be construed as being limited only to the illustrated embodiments. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section, for example as a naming convention. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, or as "contacting" another element or layer, there are no intervening elements or layers present.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments disclosed herein may include their complementary embodiments. Note that details of certain known data access operations and internal function circuits associated with a DRAM may be skipped.

FIG. 1 is a block diagram of a memory system according to an embodiment of the inventive concept.

Referring to FIG. 1, a memory system includes a controller 10 and a semiconductor device 300. The semiconductor device 300 is formed of two or more dies.

The semiconductor device 300 at least includes first and second chips 100 and 200, which are contained in a mono package. As described herein, a mono package refers to a semiconductor device including a plurality of dies on a single package substrate (e.g., package substrate 400), wherein at least two of the dies are at the same height above the package substrate. For example, a mono package may include a plurality of chips, each chip disposed at a first level above the package substrate, so that the chips are horizontally adjacent to each other. The term "semiconductor device," however, may also be used to generally refer to other items, such as a package-on-package device, or simply a semiconductor chip.

The controller 10 is connected to a host, such as a microprocessor. Receiving a data reading operation or a data writing operation from the host, the controller 10 applies a read command or a write command through first and second channels B1 and B2 to the semiconductor device 300. The first channel B1 is a channel dedicated for the first chip 100, and the second channel B2 is a channel dedicated for the second chip 200.

The first chip 100 receives a command, an address, and data through the first channel B1. The first chip 100 outputs data read from a memory cell through the first channel B1.

The second chip 200 receives a command, an address, and data through the second channel B2. The second chip 200 outputs data read from a memory cell through the second channel B2.

The first channel B1 and second channel B2 may be independent of each other, such as physically separate from each other. As such, it may be possible to send/receive commands, addresses, and/or data between the controller 10 and the first chip 100 at the same time as sending/receiving commands, addresses, and/or data between the controller 10 and the second chip 200.

In one embodiment, the first chip 100 is a first die manufactured on a wafer, and the second chip 200 is a second die manufactured on the same wafer or on another wafer.

In exemplary embodiments, a die may mean an individual chip manufactured on a wafer. A plurality of dies before a sorting process may be manufactured as individual chips on a wafer through various semiconductor fabrication processes. An oxidation process, a photolithography process, a thin film process, an etch process, or a CMP process may be one of the various semiconductor fabrication processes.

As understood from the above description, one die becomes one chip, and two dies constitute a multi-channel semiconductor device. The two dies may be formed of two chips, with one chip accessed for certain types of signals or types of accesses through one respective channel and the other chip accessed for the same types of signals or types of accesses through another respective channel. Some types of accesses that may be performed through the first or second channels include, for example, read and write access requests. The multi-channel semiconductor device may be, for example, a multi-chip package, such as a mono package.

In one embodiment, included between the first and second chips 100 and 200 in one package is an interconnection part that is used to transfer signals from one chip to another. In certain embodiments, the interconnection part, also referred to as an interconnection circuit, may be fully formed, for example, through wire bonding of a packaging level after dies on the wafer are cut. However, the interconnection part may be formed using other methods as well. This interconnection part may be thought of as a third channel, that is not dedicated to one of the chips 100 or 200, as it is configured to transfer signals to both of the chips and between the chips from one to another. Thus, this channel may be referred to herein as a non-dedicated channel or common channel. It may be used to transfer different types of signals from the types of signals passed through the first and second channels 100 and 200 described above.

For example, if a reset signal is transmitted to the first chip 100 through a signal line B3, it may also be passed from the first chip 100 to the second chip 200 through an interconnection part. The signal line B3 combined with the interconnection part may be considered to be the third channel. One of the signal line B3 and the interconnection part may also be referred to on its own as a third channel. As a result of the reset signal being transmitted through a third channel, the first and second chips 100 and 200 may be reset.

In a similar manner, when an impedance calibration signal ZQ is transmitted to the first chip 100 through the signal line B3, ZQ control on the first and second chips 100 and 200 may be made based on the ZQ signal (e.g., through the interconnection part).

In FIG. 1, an embodiment of the inventive concept is exemplified as the signal line B3 is disposed between the controller 10 and the first chip 100. However, the inventive concept is not limited thereto. The signal line B3 may be disposed between the controller 10 and the second chip 200. Also, the signal line B3 may be disposed between the controller 10 and the first chip 100 and between the controller 10 and the second chip 200.

In one embodiment, when the first chip 100 has a 4-Gbit memory capacity, the second chip 200 also has a 4-Gbit memory capacity. Hence, a 2-channel semiconductor device has an 8-Gbit memory capacity. In certain embodiments, the two chips 100 and 200 may have the same physical size as well.

As such, a 2-channel semiconductor device with an 8-Gbit memory capacity may be implemented with two dies, not one die, thereby making it possible to prevent a decrease in density on a wafer and improving availability on edge dies. Similar implementations can be made with other sized memory capacity chips, such as two 16-Gbit chips combined into a 32-Gbit, 2-channel semiconductor package. As a result, an increase in production cost may be alleviated due to an increase in yield.

In FIG. 1, an embodiment of the inventive concept is exemplified as the first and second chips 100 and 200 are contained in a mono package. However, the inventive concept is not limited thereto. For example, a 4-channel semiconductor device can be implemented by putting four chips in the mono package, and an 8-channel semiconductor device can be implemented by putting eight chips in the mono package.

In an exemplary embodiment, each of the first and second chips 100 and 200 may be a DDR4 DRAM which includes a plurality of memory cells each formed of an access transistor and a storage capacitor.

Figure 2:
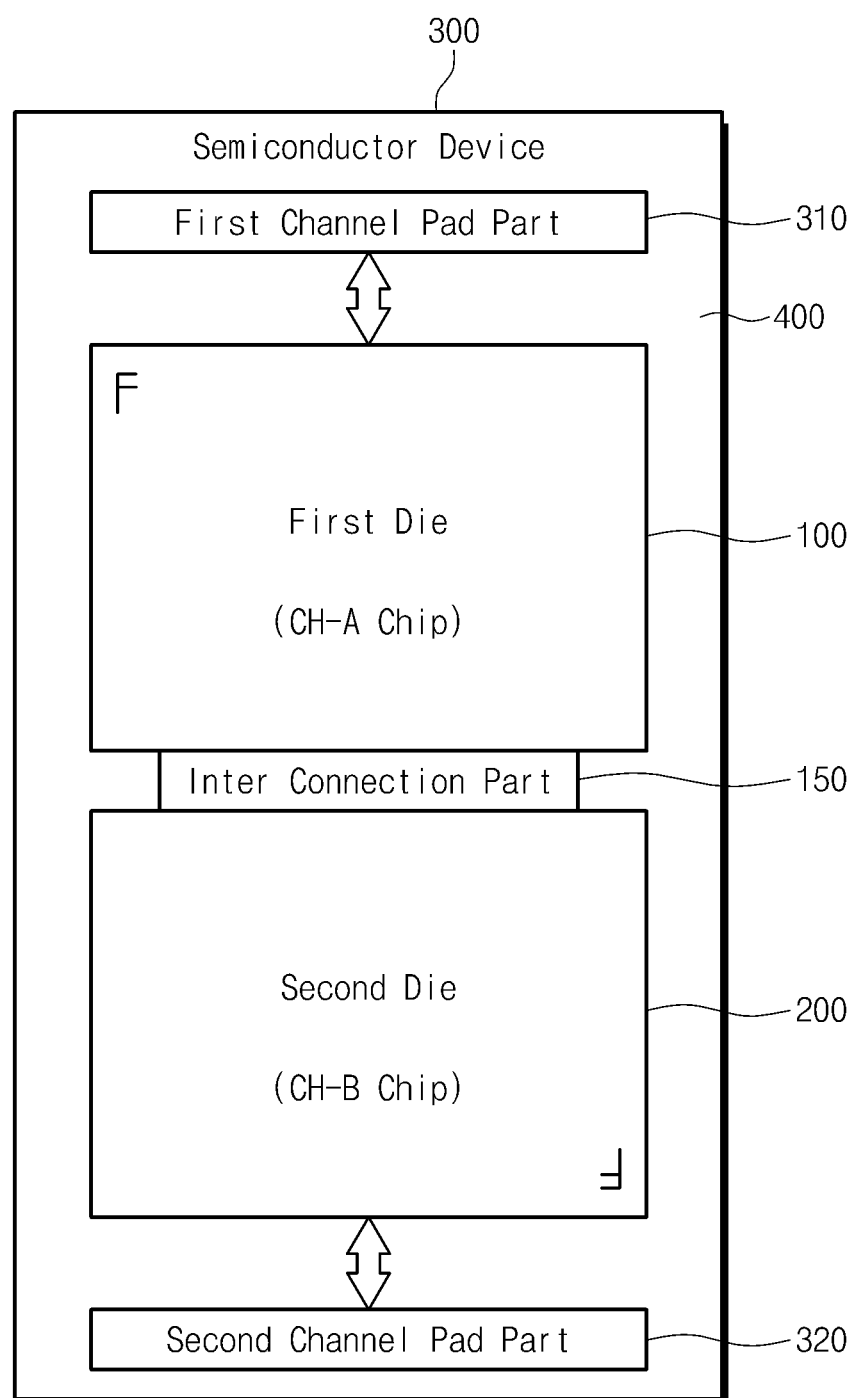
FIG. 2 is a block diagram schematically illustrating a semiconductor device shown in FIG. 1, according to one embodiment of the inventive concept.

FIG. 2 is a block diagram schematically illustrating a semiconductor device shown in FIG. 1, according to certain exemplary embodiments.

Referring to FIG. 2, a semiconductor device contained in one package includes a first die 100 acting as a first chip of a first channel CH-A, a second die 200 acting as a second chip of a second channel CH-B, and an interconnection part 150 to transmit signals between the two, counterpart chips.

The second channel CH-B is independent of the first channel CH-A. For example, the first channel CH-A may include a first set of pads on the package substrate 400 and a first set of pads on the first die 100, and the second channel CH-B may include a second set of pads on the package substrate 400 and a first set of pads on the second die 200. In one embodiment, the second die 200 has the same storage capacity and physical size as the first die 100. For example, the first die 100 and second die 200 may have the same area when viewed from an overhead view.

In one embodiment, the first and second dies 100 and 200 are disposed in a mono package, such as described in connection with FIG. 1. The first and second dies 100 and 200 may be positioned with a space therebetween, so that one edge of one die faces one edge of the other die. Also, side edges of the dies may be aligned with each other.

The interconnection part 150 is positioned between the first die 100 and the second die 200 to transmit certain types of signals, such as a reset signal or a ZQ signal to opposite dies. In one embodiment, the interconnection part 150 includes certain terminals on each of the first die 100 and second die 200 and terminals on a package substrate, and thus the interconnection part 150 is part of the mono package. For example, the interconnection part 150 may include pads on the first and second dies 100 and 200, conductive lines connected to the pads (e.g., wire bonded wires, or through substrate vias), pads on the package substrate 400 connected to the conductive lines, and internal wiring in the package substrate 400 connected from one set of pads to another set of pads of the package substrate 400. Alternatively, the first die 100 and second die 200 may each be flip-chip bonded to the package substrate 400, which includes conductive lines therein connecting between first pads that connect to terminals of the first die 100 and second pads that connect to terminals of the second die 200. The different lines within the interconnection part 150 may be connected to an external signal pad on the package substrate 400 through the first die 100 and/or the second die 200. For example, for certain types of signals, the signal may be received at one of the first or second die 100 or 200 through a pad on the package substrate 400, may pass through (and be used by) the chip 100 or 200 that receives the signal, and then be transmitted to the other chip 200 or 100 through the above-mentioned interconnection part 150 to be used by the other chip 200 or 100.

In FIG. 2, in one embodiment, when the first and second dies 100 and 200 are disposed in the package, the second die 200 rotated through by 180 degrees with respect to the first die is arranged in a rotated die shape. For example, if the first and second dies 100 and 200 are fabricated at the same wafer, one chip separated from the wafer may form the first die 100, and any other chip separated from the wafer may form the second die 200 rotated by 180 degrees. In the event that process reproducibility is over a predetermined level, the first and second dies 100 and 200 may be the same dies that are fabricated at different wafers.

In one embodiment, a first channel is formed between the first die 100 and the package substrate 400 through a first pad part 310 that is disposed at a top of the package substrate 400 (when viewed from a plan view).

In one embodiment, a second channel is formed between the second die 200 and the package substrate 400 through a second pad part 320 that is disposed at a bottom of the package substrate 400 (when viewed from a plan view).

Figure 20:
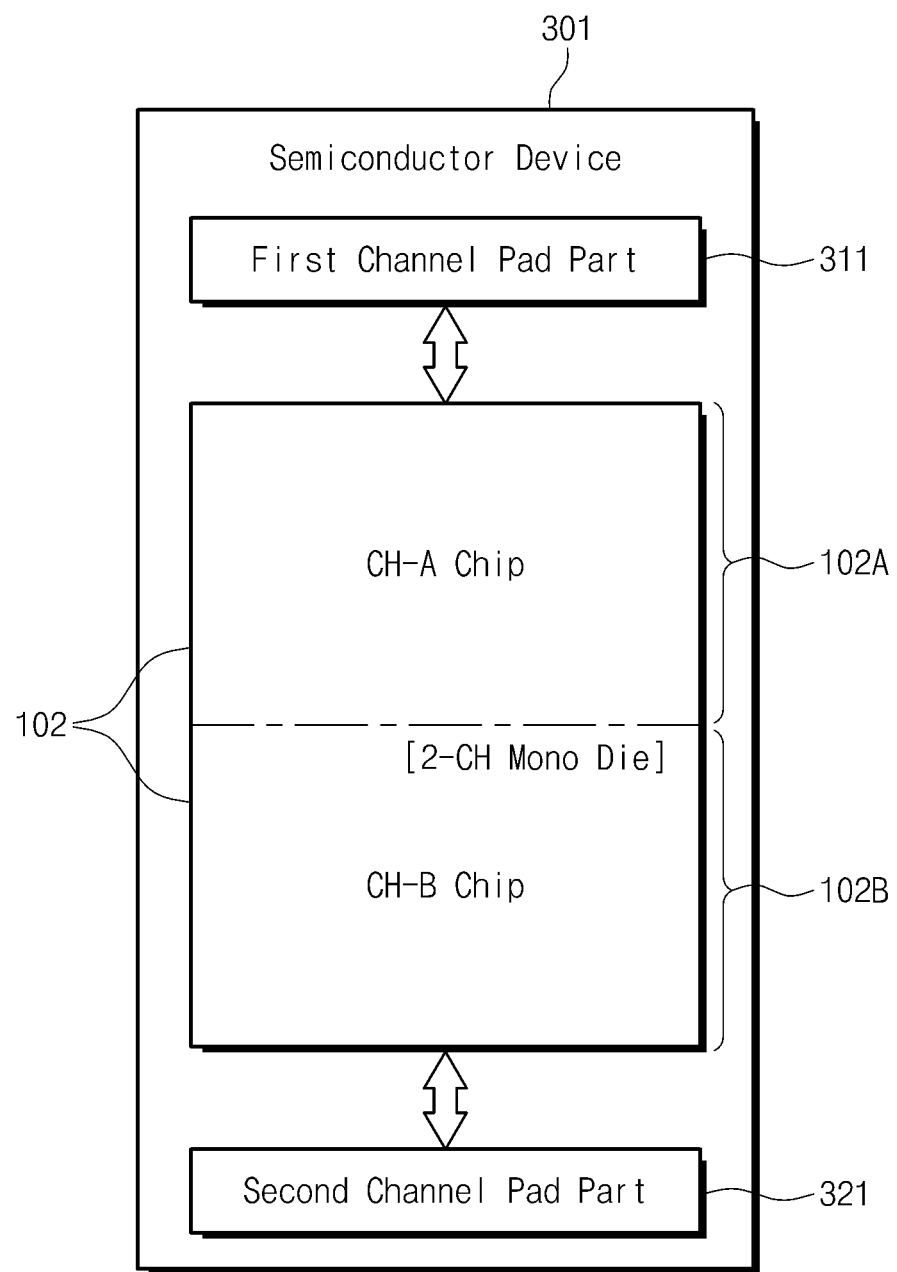
FIG. 20 is a block diagram schematically illustrating a 2-channel semiconductor device implemented with a mono die.

As compared with FIG. 20 showing a 2-channel semiconductor device implemented with a mono die (e.g., a single die), a 2-channel semiconductor device implemented with two dies as illustrated in FIG. 2 prevents a decrease in density on a wafer and improves availability of connection terminals on edges of dies.

FIG. 20 is a block diagram schematically illustrating a 2-channel semiconductor device implemented with a mono die.

Referring to FIG. 20, a semiconductor device includes a mono die 102. A first channel chip portion 102A and a second channel chip portion 102B are formed at the mono die 102. Because a 2-channel semiconductor device is implemented with a single die, the mono die 102 acts as a shared die of the 2-channel semiconductor device.

The first channel chip portion 102A connects to a package substrate through a first channel that connects to a first channel pad part 311, and the second channel chip portion 102B connects to a package substrate through a second channel that connects to a second channel pad part 321.

If semiconductor devices shown in FIGS. 2 and 20 have the same memory capacity, the size of the mono die 102 shown in FIG. 20 may be N-times (N being an integer of 2 or more) greater than that of a first die 100 or a second die 200 shown in FIG. 2. As compared with the storage device shown in FIG. 2, the semiconductor device shown in FIG. 20 causes a decrease in density on a wafer and a decrease in availability of connection terminals on edges of dies. This may mean that the production cost increases due to a decrease in yield.

Figure 3:
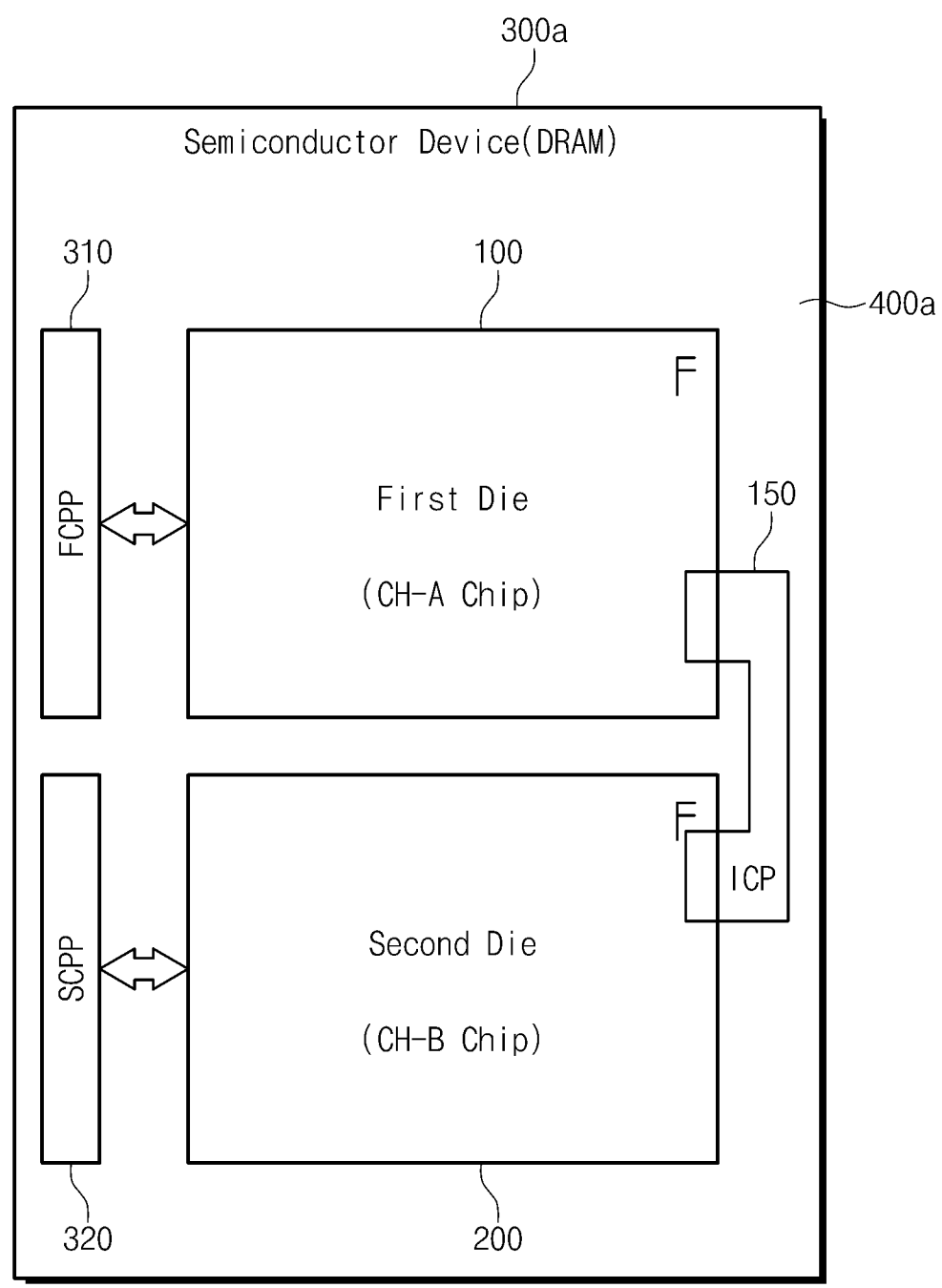
FIG. 3 is a block diagram schematically illustrating of a storage device according to another embodiment of the inventive concept.

FIG. 3 is a block diagram schematically illustrating of a storage device according to another embodiment of the inventive concept.

Referring to FIG. 3, a semiconductor device that forms a package includes a first die 100 acting as a first chip that communicates through a first channel CH-A, a second die 200 acting as a second chip that communicates through a second channel CH-B, and an interconnection part 150 to transmit signals between counterpart chips.

The second channel CH-B is independent of the first channel. In one embodiment, the second die 200 has the same storage capacity and physical size as the first die 100. The first and second dies 100 and 200 are disposed in a mono package.

The interconnection unit 150 is positioned between one side of the first die 100 and one side of the second die 200 to transmit certain types of signals, such as a reset signal or a ZQ signal to opposite dies. The interconnection part 150 may be part of a mono package including the first die 100, second die 200, and a package substrate 400a. For example, the interconnection part 150 may include pads on the first and second dies 100 and 200, conductive lines connected to the pads (e.g., wire bonded wires, or through substrate vias), pads on the package substrate 400a connected to the conductive lines, and internal wiring in the package substrate 400a. Alternatively, the first die 100 and second die 200 may each be flip-chip bonded to the package substrate 400a, which includes conductive lines therein connecting between first pads that connect to terminals of the first die 100 and second pads that connect to terminals of the second die 200.

As illustrated in FIG. 3, when the first and second dies 100 and 200 are disposed in the package, the second die 200 shifted through by a predetermined distance in a longitudinal direction from the first die 100 is arranged in a repeated die shape. For example, if the first and second dies 100 and 200 are fabricated at the same wafer, one chip separated from the wafer is the first die 100, and any other chip separated from the wafer is the second die 200 shifted by a predetermined distance. In the event that process reproducibility is above a predetermined level, the first and second dies 100 and 200 may be the same dies that are fabricated at different wafers.

In the embodiment of FIG. 3, the first die 100 is connected to a first pad part 310 disposed at a left side of the package substrate 400a (when viewed from a plan view) through a first channel.

The second die 200 is connected to a second pad part 320 disposed at a left side of the package substrate 400a (when viewed from a plan view) through a second channel.

Figure 4:
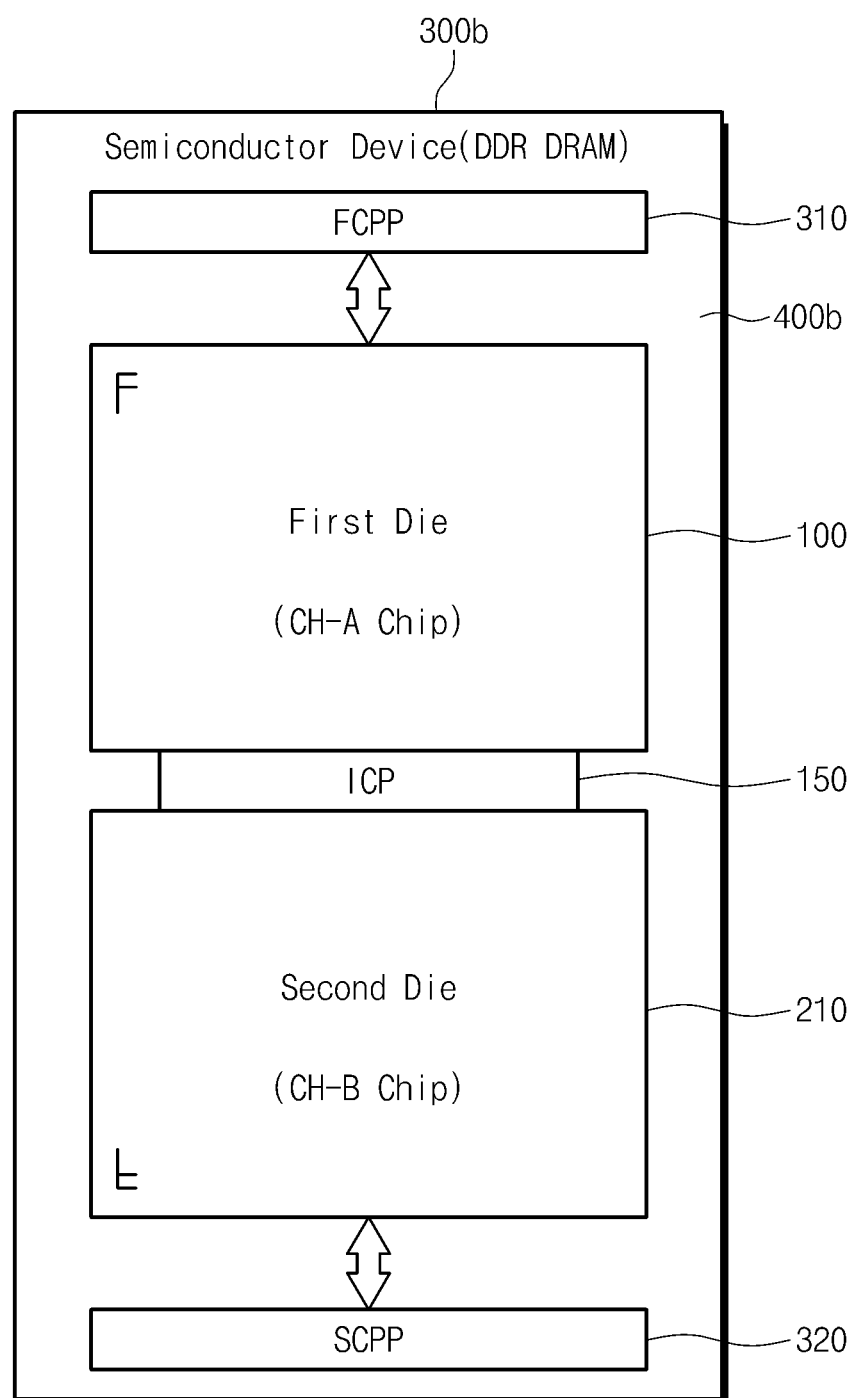
FIG. 4 is a block diagram schematically illustrating of a storage device according to still another embodiment of the inventive concept.

FIG. 4 is a block diagram schematically illustrating a storage device according to still another embodiment of the inventive concept.

Referring to FIG. 4, a semiconductor device contained in one package includes a first die 100 acting as a first chip connected to a first channel CH-A, a second die 200 acting as a second chip connected to a second channel CH-B, and an interconnection part 150 to transmit signals between counterpart chips.

The second channel CH-B is independent of the first channel CH-A. In one embodiment, the second die 200 has the same storage capacity and physical size as the first die 100. The first and second dies 100 and 200 are disposed in a mono package.

The interconnection part 150 is positioned between the first die 100 and the second die 200 to transmit certain types of signals, such as a reset signal or a ZQ signal, between the two dies. The interconnection part 150 is formed to be part of the mono package.

In one embodiment, the first and second dies are line-symmetrical with respect to a center line of a transversal direction to achieve a mirror die shape and are disposed in the package. For example, if the first and second dies 100 and 200 are fabricated as different dies at different wafers, one chip separated from a first wafer is the first die 100, and another chip separated from a second wafer is the second die 200 that is disposed in a line-symmetrical way.

The first die 100 is connected to a first channel through a first pad part 310 that is disposed at a top of the mono package (when viewed in a plan view).

The second die 200 is connected to a second channel through a second pad part 320 that is disposed at a bottom of the mono package (when viewed in a plan view).

Figure 5:
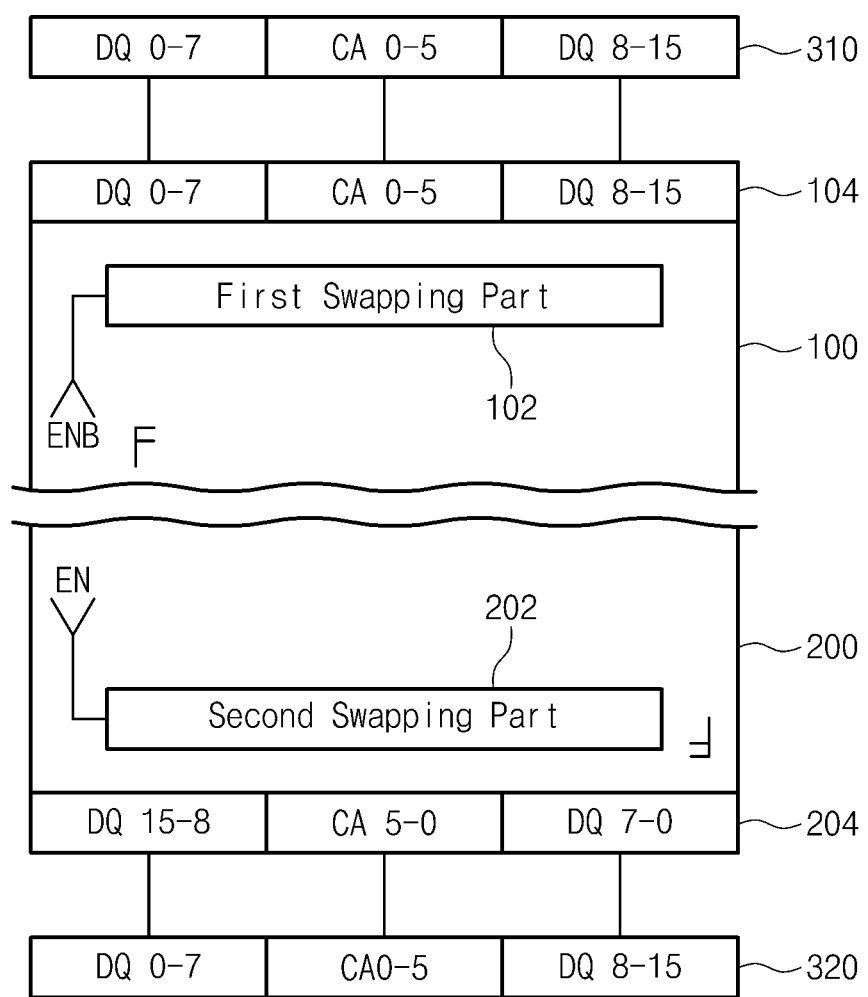
FIG. 5 is a diagram showing a connection structure among die pads of a semiconductor device shown in FIG. 2, according to one embodiment of the inventive concept.

FIG. 5 is a diagram showing a connection structure among die pads of a semiconductor device shown in FIG. 2, according to one exemplary embodiment.

If a 2-channel semiconductor device is implemented as described with reference to FIG. 2, ordering of pads of the second die 200 are changed due to rotation of 180 degrees. When the first and second dies 100 and 200 are implemented with the same die, the second die 200 is rotated by 180 degrees so as to be disposed to be opposite to the first die 100. Hence, when seen from a second die 200, data output pads DQ0 through DQ7 are located at a right lower part of a figure, in reverse order. Referring to a symbol 'F', when the first die 100 is rotated by 180 degrees, the data output pads DQ0 through DQ7 shown at a left top part of a first die pad part 104 are located at the right lower part of a second die pad part 204, in reverse order from left to right when viewed in a plan view.

Pads DQ0 through DQ7, CA0 through CA5, and DQ8 through DQ15 of the first die pad part 104 are sequentially disposed from a left end of a figure. Pads DQ0 through DQ7, CA0 through CA5, and DQ8 through DQ15 of the second die pad part 204 are sequentially disposed from a right end of the figure (e.g., when all are viewed from a plan view).

Thus, the first die pad part 104 includes pads DQ0 through DQ7, CA0 through CA5, and DQ8 through DQ15 sequentially arranged from a left side of the figure. As can be seen, the order of pads of the first die pad part 104 is equal to that of pads of the first channel pad part 310 in the same direction. This may mean that die pad swapping is unnecessary. As such, a first swapping part 102 of the first die 100, which may be formed of certain internal wiring and circuitry, does not conduct die pad swapping in response to a swapping disable signal ENB.

However, the second die pad part 204 includes pads DQ15 through DQ8, CA5 through CA0, and DQ7 through DQ0 sequentially arranged from a left side of the figure. As such, the order of pads of the second die pad part 204 is different from that of pads of the second channel pad part 320 in the same direction (e.g., they are the reverse of each other).

A second swapping part 202 of the second die 200 conducts die pad swapping in response to a swapping enable signal EN. For example, in one embodiment, the data output pads DQ15 through DQ8 of the second die pad part 204 are respectively connected to the data output pads DQ0 through DQ7 of the second channel pad part 320 and the data output pads DQ7 through DQ0 of the second die pad part 204 are respectively connected to the data output pads DQ8 through DQ15 of the second channel pad part 320. Also, the column address pads CA5 through CA0 of the second die pad part 204 are cross coupled to the column address pads CA0 through CA5 of the second channel pad part 320. Therefore, signals received at the die pads 204 of the second die 200 are received in reverse order, and need to be swapped and reordered in order for the accurate signals to reach the internal circuitry of the second die 200.

Figure 6:
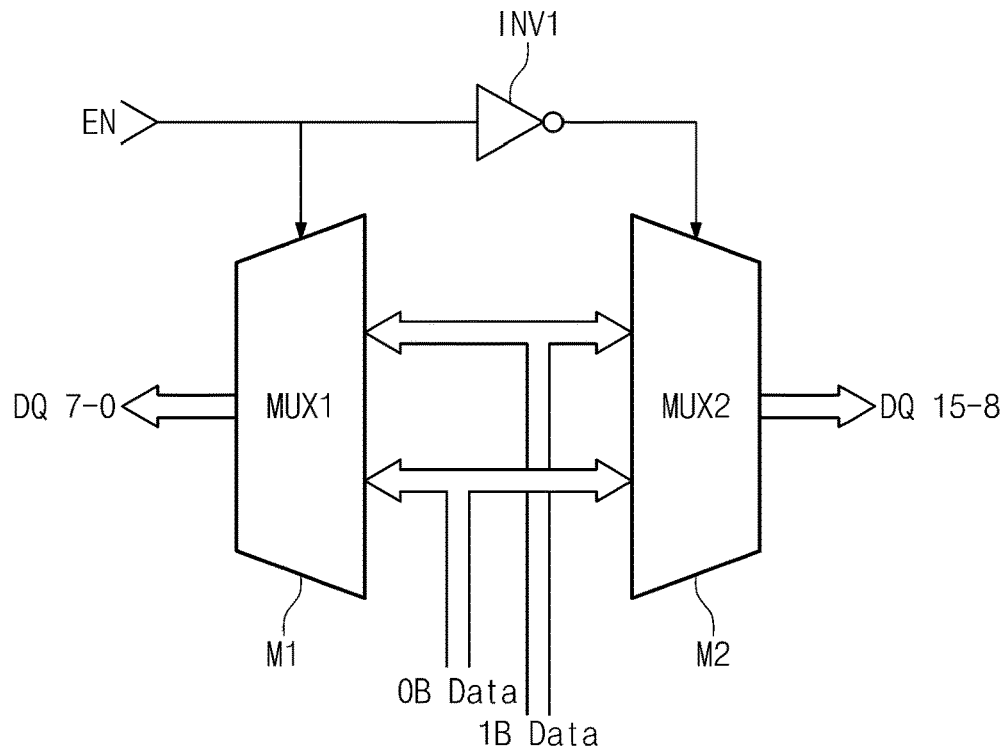
FIG. 6 is a block diagram for describing how output signals of FIG. 5 are swapped, according to one embodiment of the inventive concept.

FIG. 6 is a block diagram for describing how output signals of FIG. 5 are swapped, according to one exemplary embodiment.

Referring to FIG. 6, a data swapping part, which may include various circuit elements and may be referred to as a swapping circuit, swaps and reverses data output signals and includes first and second multiplexers M1 and M2. The data swapping part, also referred to as a data swapping circuit, may be installed in a first swapping part/circuit 102 and/or a second swapping part/circuit 202 shown in FIG. 5. In one embodiment, if the die 100 is identical to the die 200, the first swapping part 102 is the same as the second swapping part 202, but in a different chip.

In one embodiment, when a swapping enable signal EN is in an active state (e.g., has a high level), swapping occurs, such that the first multiplexer M1 switches '1B' data received from or transmitted to the second chip 200 to data output pads DQ7 through DQ0 of the second die pad part 204. Receiving a low level through an inverter INV1, also based on the swapping enable signal EN in an active state, swapping occurs such that the second multiplexer M2 switches '0B' data received from or transmitted to the second chip 200 to data output pads DQ15 through DQ8. The '0B' data means 8-bit data (0 through 7), and the '1B' data means 8-bit data (8 through 15).

As understood from the above description, the data swapping part shown in FIG. 6 conducts data swapping by the byte.

When the swapping enable signal EN has an inactive state, that is, a low level, the first multiplexer M1 switches the '0B' data into the data output pads DQ0 through DQ7. Also, receiving a high level through the inverter INV1 (indicating an inactive state), the second multiplexer M2 switches the '1B' data into the data output pads DQ8 through DQ15. Thus, the '0B' data and the '1B' data is directly transferred to the data output pads DQ0 through DQ7 without swapping of a byte units.

Figure 7:
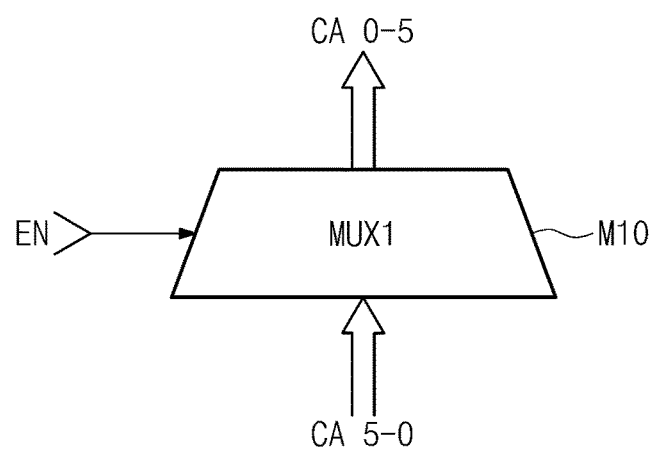
FIG. 7 is a block diagram for describing how column addresses of FIG. 5 are swapped, according to one embodiment of the inventive concept.

FIG. 7 is a block diagram for describing how column addresses of FIG. 5 are swapped, according to one exemplary embodiment.

Referring to FIG. 7, an address swapping part, which may include various circuit elements, swaps a column address and includes a multiplexer M10. The address swapping part, also referred to as a swapping circuit, may be installed in a first swapping part 102 and/or a second swapping part 202 shown in FIG. 5.

Receiving a swapping enable signal EN with a high level (e.g., active state), the multiplexer M10 swaps an input column address CA5 through CA0 for an output column address CA0 through CA5. For example, the input column address signal CA5 is swapped for an output column address signal CA0, the input column address signal CA4 for an output column address signal CA1, etc.

Figure 8:
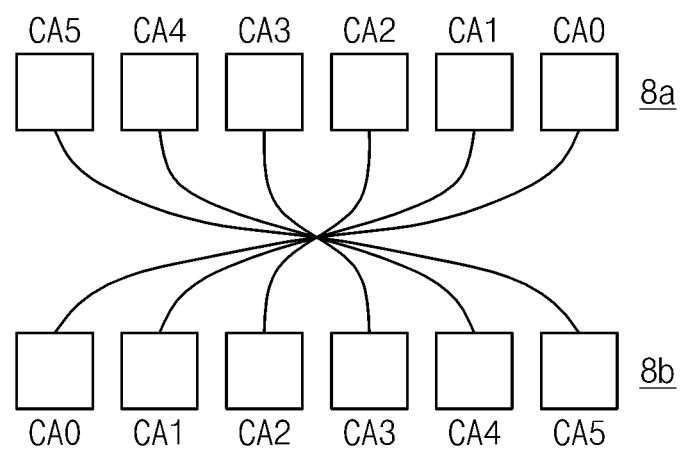
FIG. 8 is a block diagram for describing how a column address is swapped based on a PCB, according to one embodiment of the inventive concept.

FIG. 8 is a block diagram for describing how a column address is swapped based on a printed circuit board (PCB), according to an alternative embodiment.

Referring to FIG. 8, in one embodiment, input column address pads CA5 through CA0 corresponding to '8a' and output column address pads CA0 through CA5 corresponding to '8b' are cross coupled through a PCB pattern or bonding wires.

With the PCB-based swapping scheme, an input column address CA5 through CA0 is swapped for an output column address CA0 through CA5. For example, the input column address signal CA5 is connected to an output column address signal CA5, the input column address signal CA4 to an output column address signal CA4, etc. In this embodiment, an internal address swapping part such as shown in FIG. 7 need not be used.

It should be noted, that in different embodiments, such as shown in FIG. 3 or 4, a swapping circuit may not be necessary. For example, in these embodiments, the order of pads that connect to the pads in the package substrate may be the same as those package substrate pads, and so the need for swapping signals may not be required.

Figure 9:
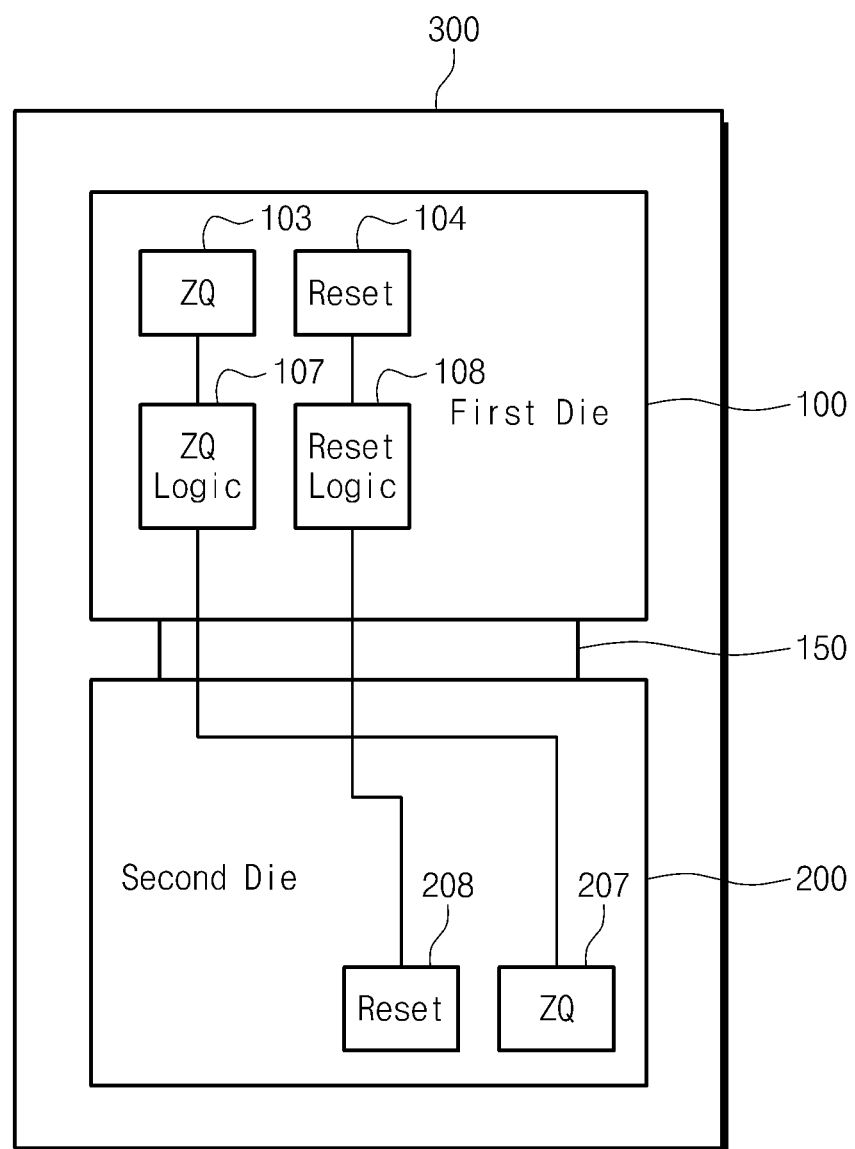
FIG. 9 is a block diagram for describing how control signals are transmitted to counterpart dies through an interconnection part described with reference to FIGS. 2 through 4, according to one embodiment of the inventive concept.

FIG. 9 is a block diagram for describing how control signals are transmitted to counterpart dies through an interconnection part described with reference to FIGS. 2 through 4, according to certain embodiments.

Referring to FIG. 9, a first die 100 of a 2-channel semiconductor device 300 includes a ZQ pad 103 and a reset pad 104, and a second die 200 thereof includes a ZQ pad 207 and a reset pad 208.

The first die 100 further includes ZQ logic 107 and reset logic 108. In FIG. 9, an embodiment of the inventive concept is exemplified as the first die 100 includes the ZQ logic 107 and the reset logic 108. However, the inventive concept is not limited thereto. For example, the second die 200 may be implemented to include ZQ logic and reset logic instead of the first die 100, such that external signals are first sent to the second die 200. Alternatively, certain logic may be included in both the first die 100 and the second die 200.

Provided to the ZQ logic 107 is a ZQ signal that is applied to the ZQ pad 103 of the first die 100. The ZQ logic 107 makes ZQ calibration on the first die 100. The ZQ logic 107 provides the ZQ signal to the ZQ pad 207 of the second die 200 through an interconnection part 150. Alternatively, if a separate ZQ logic is included on the second die 200, then a signal line from the ZQ pad 103 of the first die 100 may be additionally connected to the interconnection part 150, which connects to the ZQ logic on the second die 200, so that a ZQ signal can be sent through the first die 100 to the second die 200 to perform ZQ calibration.

Therefore, in one embodiment, the second die 200 (though not shown) also includes ZQ logic, and using the ZQ logic, the second die 200 conducts ZQ calibration on the second die 200 in response to the ZQ signal transmitted through the interconnection part 150.

Provided to the reset logic 108 is a reset signal that is applied to the reset pad 104 of the first die 100. The reset logic 108 performs a reset operation on the first die 100. The reset logic 108 provides the reset signal to the reset pad 208 or reset logic of the second die 200 through the interconnection part 150.

The second die 200 performs a reset operation on the second die 200 in response to the reset signal transmitted through the interconnection part 150.

In one embodiment, a ZQ calibration signal may be applied to a semiconductor device after the reset signal is applied to the semiconductor device. A result of the ZQ calibration may be used to adjust an on-resistance value and an on-die termination value of an output driver.

When an operation control signal such as a ZQ signal or a reset signal is applied through one die, the other die receives the operation control signal in common through the interconnection part 150. This may mean that the dies are controlled together, for certain functions.

In FIG. 9, an embodiment of the inventive concept is exemplified as an operation control signal is applied through the first die 100. However, the inventive concept is not limited thereto. For example, the operation control signal may be applied to the first die 100 through the second die 200.

As described above, according to certain embodiments, certain first types of signals (e.g., data, address, and command signals), can be sent to multiple chips in a multi-chip package (e.g., a mono-package) through separated, dedicated channels. For example, a first chip can have a first set of pads that connect to a first respective set of pads on a package substrate, and a second chip can have a second set of pads that connect to a second respective set of pads on the package substrate. In addition, certain types of signals (e.g., operational control signals such as a ZQ signal and reset signal) can be sent to the multiple chips through a common, non-dedicated channel. For example, a semiconductor device may receive a second type of signal different from a first type of signal received independently by the chips of the semiconductor device, and may apply the second type of signal to both the first memory chip and the second memory chip via a common, third channel.

In one embodiment, the common channel is a channel that connects from a package substrate to a first chip, and then connects from the first chip to one or more additional chips through an interconnection circuit that electrically connects the first chip to the one or more additional chips. The interconnection circuit may pass, for example, through the package substrate on which the chips are mounted.

Figure 10:
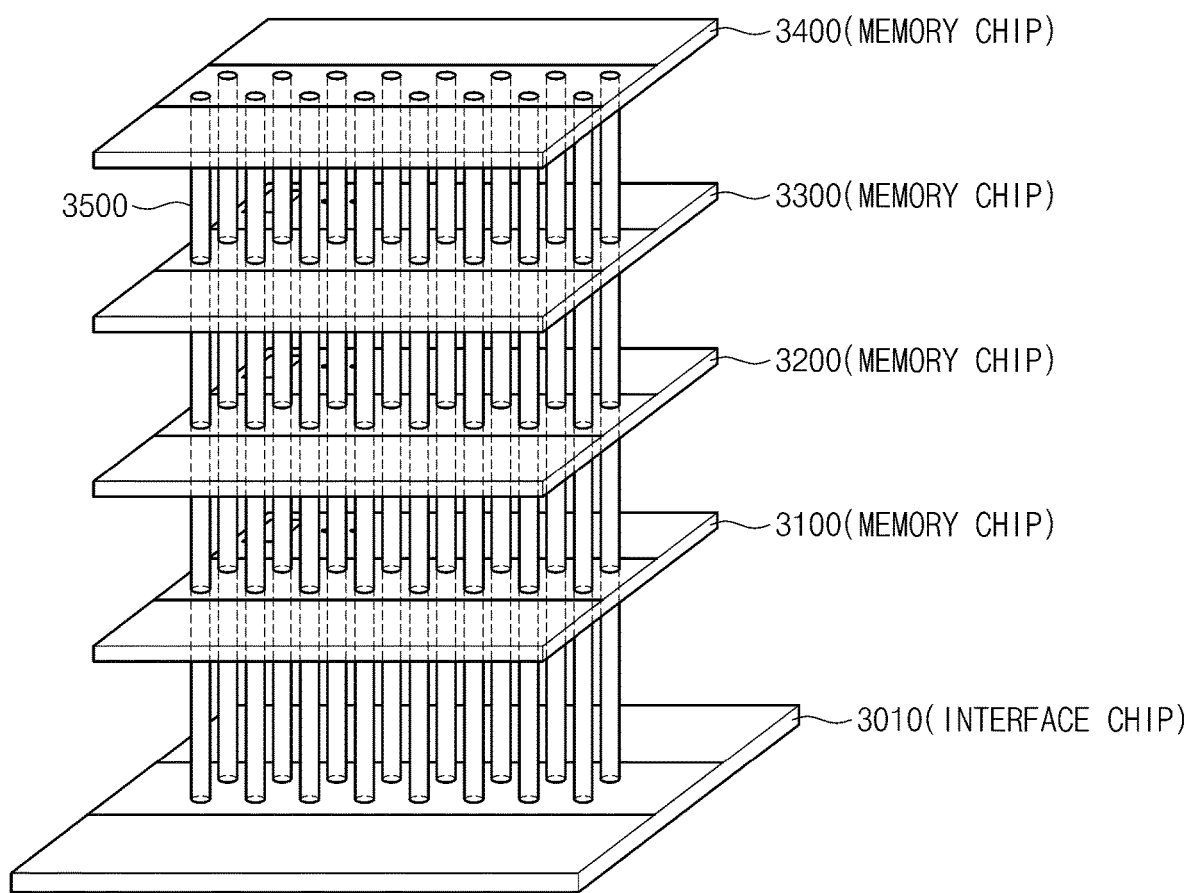
FIG. 10 is a diagram schematically illustrating an application of the inventive concept applied to a memory system stacked through through-silicon via, according to one embodiment of the inventive concept.

FIG. 10 is a diagram schematically illustrating an application of certain aspects of the inventive concept applied to a memory system stacked through through-silicon via (TSV).

Referring to FIG. 10, an interface chip 3010 is placed at the lowermost layer, and memory chips 3100, 3200, 3300, and 3400 are placed over the interface chip 3010. A gap between chips is connected through micro bumps, and a chip itself is connected through through-silicon via (TSV) 3500. For example, the number of chips stacked is 2 or more.

In FIG. 10, each of the memory chips 3100, 3200, 3300, and 3400 is implemented with a multi-channel semiconductor device formed of two or more dies as described with reference to FIG. 1, thereby improving yield and reducing production cost.

Figure 11:
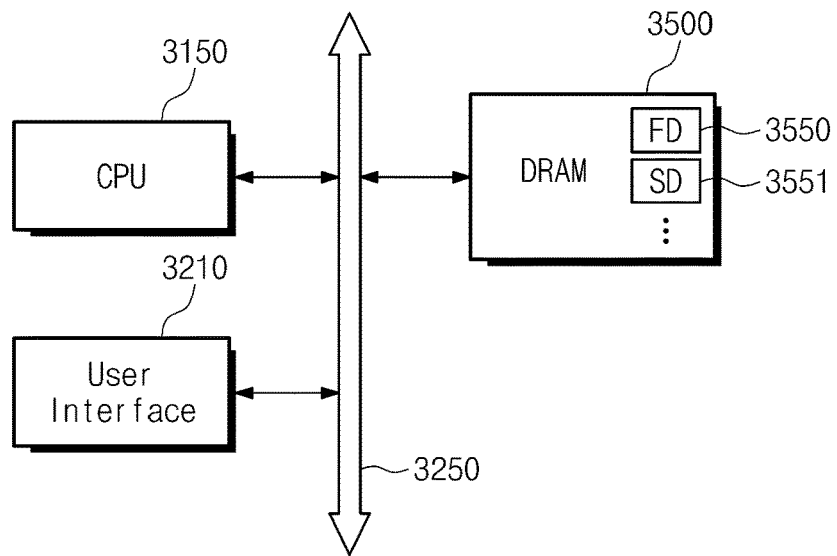
FIG. 11 is a diagram showing an application of the inventive concept applied to an electronic system, according to one embodiment of the inventive concept.

FIG. 11 is a diagram showing an application of certain aspects of the inventive concept applied to an electronic system.

Referring to FIG. 11, a DRAM 3500, a central processing unit (CPU) 3150, and a user interface 3210 are connected through a system bus 3250.

If an electronic system is an electronic device such as a portable electronic device, a separate interface may be connected with an external communication device. The communication device may include, for example, the following: a DVD player, a computer, a set top box (STB), a game machine, and a digital camcorder.

A DRAM 3500 may be implemented such that two or more dies 3550 and 3551 are contained in one package. For example, at least two of the semiconductor chips in the DRAM may be connected to a package substrate in the DRAM according to one of the configurations described above in connection with FIGS. 1-9. In addition, the DRAM 3500 may be packaged according to any of a variety of different packaging technologies. Examples of such packaging technologies may include the following: PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

In FIG. 11, a flash memory may be further connected to the bus 3250. However, the inventive concept is not limited thereto. For example, a variety of nonvolatile storage devices may be used.

The nonvolatile storage may store data information having various data formats, such as a text, a graphic, and a software code.

Figure 12:
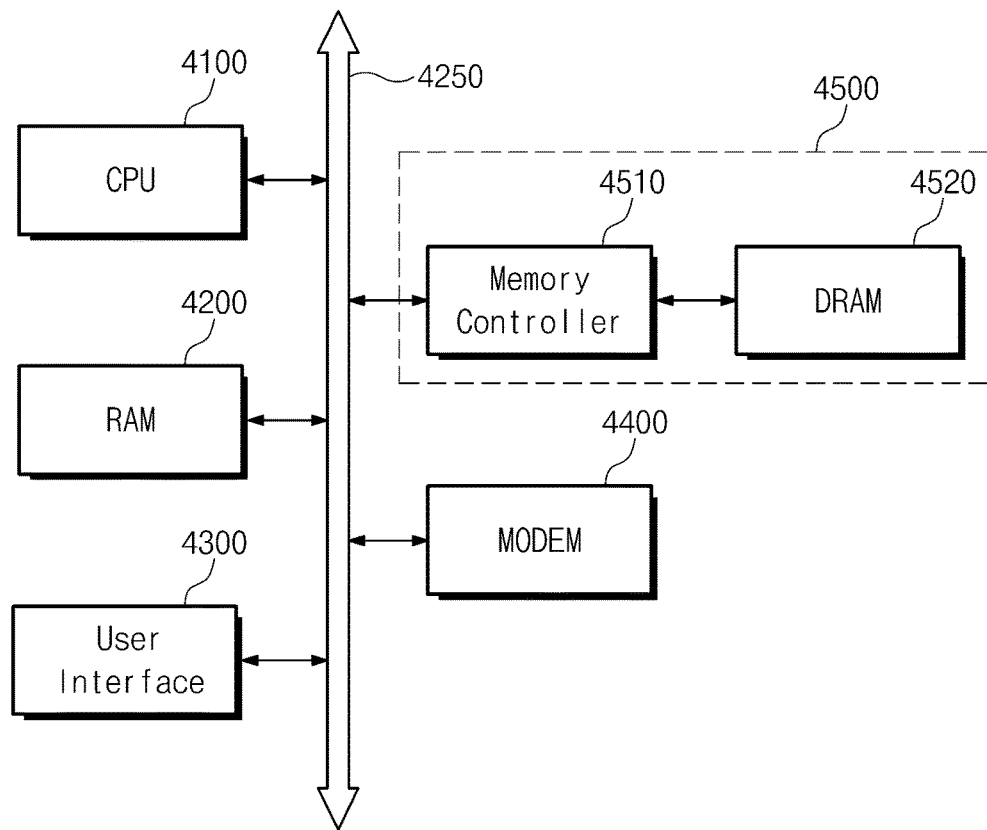
FIG. 12 is a block diagram schematically illustrating an application of the inventive concept applied to a computing device, according to one embodiment of the inventive concept.

FIG. 12 is a block diagram schematically illustrating an application of certain aspects of the inventive concept applied to a computing device.

Referring to FIG. 12, a computing device includes a memory system 4500 including a DRAM 4520 and a memory controller 4510. The computing device may include an electronic device such as an information processing device or a computer. For example, the computing device may further include a modem 4250, a CPU 4100, a RAM 4200, and a user interface 4300 that are electrically connected to a system bus 4250. Data processed by the CPU 4100 or data input from an external device may be stored in the memory system 4500.

The DRAM 4520 may be a DDR4 DRAM, and in one embodiment includes an interconnection part as described with reference to FIG. 2 and is formed of two or more dies contained in a mono package, thereby improving yield of fabrication and making it possible to reduce production cost of the computing device.

The computing device may be applied to an electronic device such as a solid state disk, a camera image sensor, an application chipset, and so on. For example, the memory system 4500 may be formed of a solid state drive (SSD). In this case, the computing device may store mass data at the memory system 4500 stably and reliably.

In one embodiment, the memory system 4500 is implemented with a device such as described with reference to FIG. 1, thereby improving performance of the computing device. The memory controller 4510 sends a command, an address, data, and other control signals to the DRAM 4520.

The CPU 4100 functions as a host and controls an overall operation of the computing device.

A host interface between the CPU 4100 and the memory controller 4510 may include a variety of protocols for exchanging data between the memory controller 4510 and a host. The memory controller 4510 is configured to communicate with the host or an external device by means of at least one of various protocols including the following: USB (Universal Serial Bus) protocol, MMC (multimedia card) protocol, PCI (peripheral component interconnection) protocol, PCI-E (PCI-express) protocol, ATA (Advanced Technology Attachment) protocol, Serial-ATA protocol, Parallel-ATA protocol, SCSI (small computer small interface) protocol, ESDI (enhanced small disk interface) protocol, and IDE (Integrated Drive Electronics) protocol.

The device shown in FIG. 12 may be provided as one of various components of an electronic device, such as a computer, a ultra-mobile personal computer (UMPC), a digital picture player, a digital video recorder, a digital video player, storage forming a data center, a device for transmitting and receiving information in a wireless environment, one of various electronic devices constituting a home network, one of various electronic devices constituting a computer network, one of various electronic devices constituting a telematics network, a radio frequency identification (RFID) device, and one of various components constituting a computing system.

Figure 13:
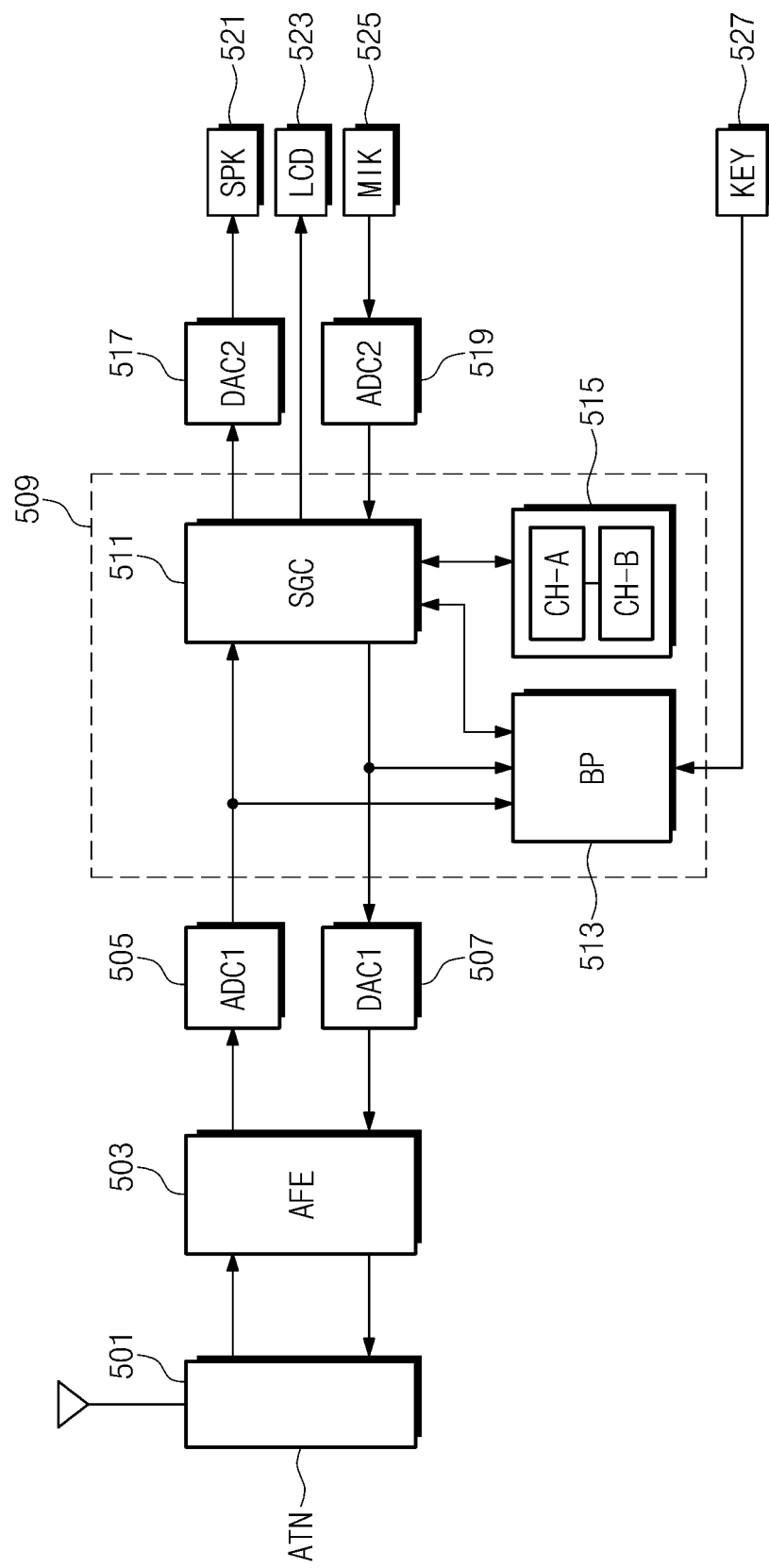
FIG. 13 is a block diagram schematically illustrating an application of the inventive concept applied to a smart phone, according to one embodiment of the inventive concept.

FIG. 13 is a block diagram schematically illustrating an application of certain aspects of the inventive concept applied to a smart phone.

Referring to FIG. 13, there is illustrated a block diagram of a portable telephone (e.g., a smart phone) including a multi-channel DRAM 515. The smart phone includes an antenna (ATN) 501, an analog front end block (AFE) 503, analog-to-digital converters (ADC1, ADC2) 505 and 519, digital-to-analog converters (DAC1, DAC2) 507 and 517, a baseband block (BBD) 509, a speaker (SPK) 521, a liquid crystal monitor (LCD) 523, a microphone (MIK) 525, and an input key (KEY) 527.

The analog front end block 503 may be a circuit block that is formed of an antenna switch, a band pass filter, various amplifiers, a power amplifier, a phase locked loop, a voltage controlled oscillator, an orthogonal demodulator, an orthogonal modulator, etc. and transmits and receives radio waves. The baseband block 509 includes a signal processing circuit (SGC) 511, a base band processor (BP) 513, and a multi-channel DRAM 515.

Below, an operation of the smart phone will be described with reference to FIG. 13. When an image including voice and character information is received, a radio wave input from the antenna 501 is provided to the analog-to-digital converter 505 through the analog front end block 503 for waveform equalization and analog-to-digital conversion. An output signal of the analog-to-digital converter 505 is provided to the signal processing circuit 511 of the baseband block 509 for voice and image processing. A voice signal is transferred to the speaker 521 through the digital-to-analog converter 517, and an image signal is transferred to the liquid crystal monitor 523.

In the event that a voice signal is generated, a signal input through the microphone 525 is provided to the signal processing circuit 511 through the analog-to-digital converter 519 for voice processing. An output of the signal processing circuit 511 is transferred from the digital-to-analog converter 507 to the antenna 501 through the analog front end block 503. In the event that character information is generated, a signal input from the input key 527 is provided to the antenna 501 through the baseband block 509, the digital-to-analog converter 507, and the analog front end block 503.

In FIG. 13, the multi-channel DRAM 515 is implemented with a multi-channel semiconductor memory device having first and second dies as described with reference to FIG. 2. In one embodiment, the multi-channel DRAM 515 is accessed by the base band processor 513 through a first channel and by an application processor (not shown) through a second channel. As such that one memory chip may be shared by two processors.

In FIG. 13, an embodiment of the inventive concept is exemplified as the smart phone includes the multi-channel DRAM 515. However, the inventive concept is not limited thereto. In some cases, the multi-channel DRAM may be replaced with a multi-channel MRAM.

A volatile semiconductor memory device, such as DRAM or SRAM, loses contents stored therein at power-off.

In contrast, a nonvolatile semiconductor memory device, such as a magnetic random access memory (MRAM), retains contents stored therein even at power-off. The nonvolatile semiconductor memory device may be used to store data when data has to be maintained even at power failure or power-off.

When implemented with STT-MRAM (Spin transfer torque magneto resistive random access memory), a multi-channel memory device may include advantages of the MRAM along with advantages described with reference to FIG. 1.

An STT-MRAM cell is formed of an MTJ (Magnetic Tunnel Junction) element and a selection transistor. The MTJ element contains a fixed layer, a free layer, and a tunnel layer formed between the fixed layer and the free layer. A magnetization direction of the fixed layer is fixed, while a magnetization direction of the free layer is opposite to or the same as that of the fixed layer depending on a condition.

Figure 14:
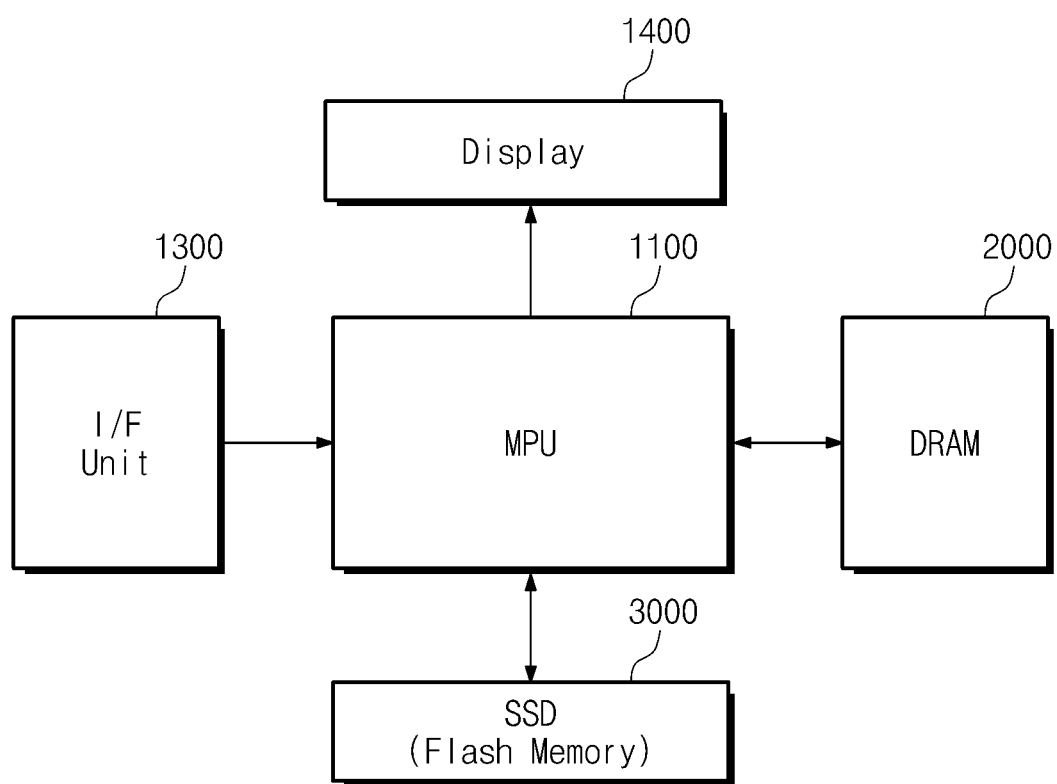
FIG. 14 is a block diagram schematically illustrating application of the inventive concept applied to a mobile device, according to one embodiment of the inventive concept.

FIG. 14 is a block diagram schematically illustrating application of certain aspects of the inventive concept applied to a mobile device.

Referring to FIG. 14, a mobile device may be an electronic device such as a notebook computer or a handheld electronic device and includes a micro processing unit (MPU) 1100, an interface unit 1300, a display 1400, a DRAM 200, and a solid state drive 3000.

In some cases, the DRAM 2000, the MPU 1100, and the SSD 3000 are provided in the form of package. This may mean that the DRAM 2000 and the flash memory 3000 are embedded in the mobile device.

The DRAM 2000 is a memory that is implemented with two or more dies described with reference to FIG. 1.

If the mobile device is a portable communications device, the interface unit 1300 may be connected to a modem and transceiver block which is configured to perform a communication data transmitting and receiving function and a data modulating and demodulating function.

The MPU 1100 controls an overall operation of the mobile device, depending on a given program.

The DRAM 2000 is connected to the MPU 1100 through a system bus and functions as a buffer memory or a main memory of the MPU 1100.

The flash memory 3000 includes a NOR or NAND flash memory to store mass information.

The display 1400 is implemented with a liquid crystal having a backlight, a liquid crystal having an LED light source, or a touch screen (e.g., OLED). The display 1400 may be an output device for displaying images (e.g., characters, numbers, pictures, etc.) in color.

There is described an embodiment in which the mobile device is a mobile communications device. In some cases, the mobile device may be used as a smart card by adding or removing components to or from the mobile device.

The mobile device may be connected to an external communication device through a separate interface. The external communication device may include, for example, the following: a DVD player, a computer, a set top box (STB), a game machine, and a digital camcorder.

Although not shown in FIG. 14, the mobile device may further include the following: an application chipset, a camera image processor (CIS), and a mobile DRAM.

In FIG. 14, an embodiment of the inventive concept is exemplified as a flash memory is used. However, the inventive concept is not limited thereto. For example, a variety of nonvolatile storages may be used.

The nonvolatile storage may store data information having various data formats, such as a text, a graphic, a software code, and so on.

Figure 15:
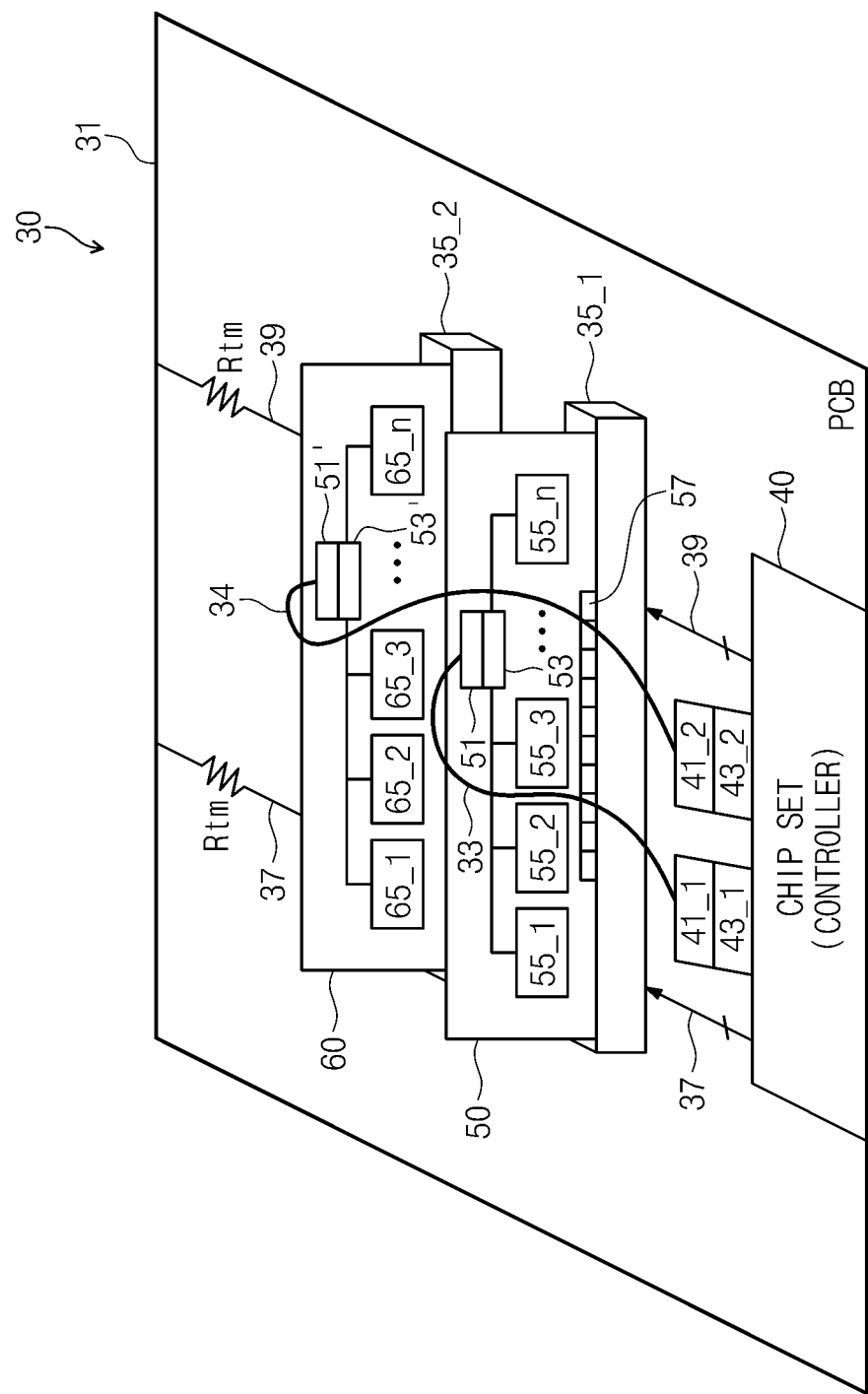
FIG. 15 is a block diagram schematically illustrating an application of the inventive concept applied to an optical I/O scheme, according to one embodiment of the inventive concept.

FIG. 15 is a block diagram schematically illustrating an application of certain aspects of the inventive concept applied to an optical I/O scheme.

Referring to FIG. 15, a memory system 30 adopting a high-speed optical input/output scheme includes a chipset 40 as a controller and memory modules 50 and 60 mounted on a PCB substrate 31. The memory modules 50 and 60 are inserted in slots 35_1 and 35_2 installed on the PCB substrate 31, respectively. The memory module 50 includes a connector 57, DRAM chips 55_1 through 55_$n$, an optical I/O input unit 51, and an optical I/O output unit 53.

The optical I/O input unit 51 includes a photoelectric conversion element (e.g., a photodiode) to convert an input optical signal into an electrical signal. The electrical signal output from the photoelectric conversion element is received by the memory module 50. The optical I/O output unit 53 includes an electro-photic conversion element (e.g., a laser diode) to convert an electrical signal output from the memory module 50 into an optical signal. In some cases, the optical I/O output unit 53 further includes an optical modulator to modulate a signal output from a light source.

An optical cable 33 performs a role of optical communications between the optical I/O input unit 51 of the memory module 50 and an optical transmission unit 41_1 of the chipset 40. The optical communications may have a bandwidth (e.g., more than score gigabits per second). The memory module 50 receives signals or data from signal lines 37 and 39 of the chipset 40 through the connector 57 and performs high-speed data communications with the chipset 40 through the optical cable 33. Meanwhile, resistors Rtm installed at lines 37 and 39 are termination resistors.

In the memory system 30 with the optical input/output structure shown in FIG. 15, multi-channel DRAMs 55_1 through 55_$n$ according to an embodiment of the inventive concept may be contained in one package.

Thus, the chipset 40 independently performs a data reading operation and a data writing operation through the multi-channel DRAMs 55_1 through 55_$n$ by the channel. In this case, when applied to one die, a reset signal or a ZQ signal is applied to any other die through an interconnection part, thereby making it possible to reduce production cost without lowering performance of the memory system 30.

In the case that the memory system 30 of FIG. 15 is an SSD, the multi-channel DRAMs 55_1 through 55_$n$ may be used as a user data buffer.

Figure 16:
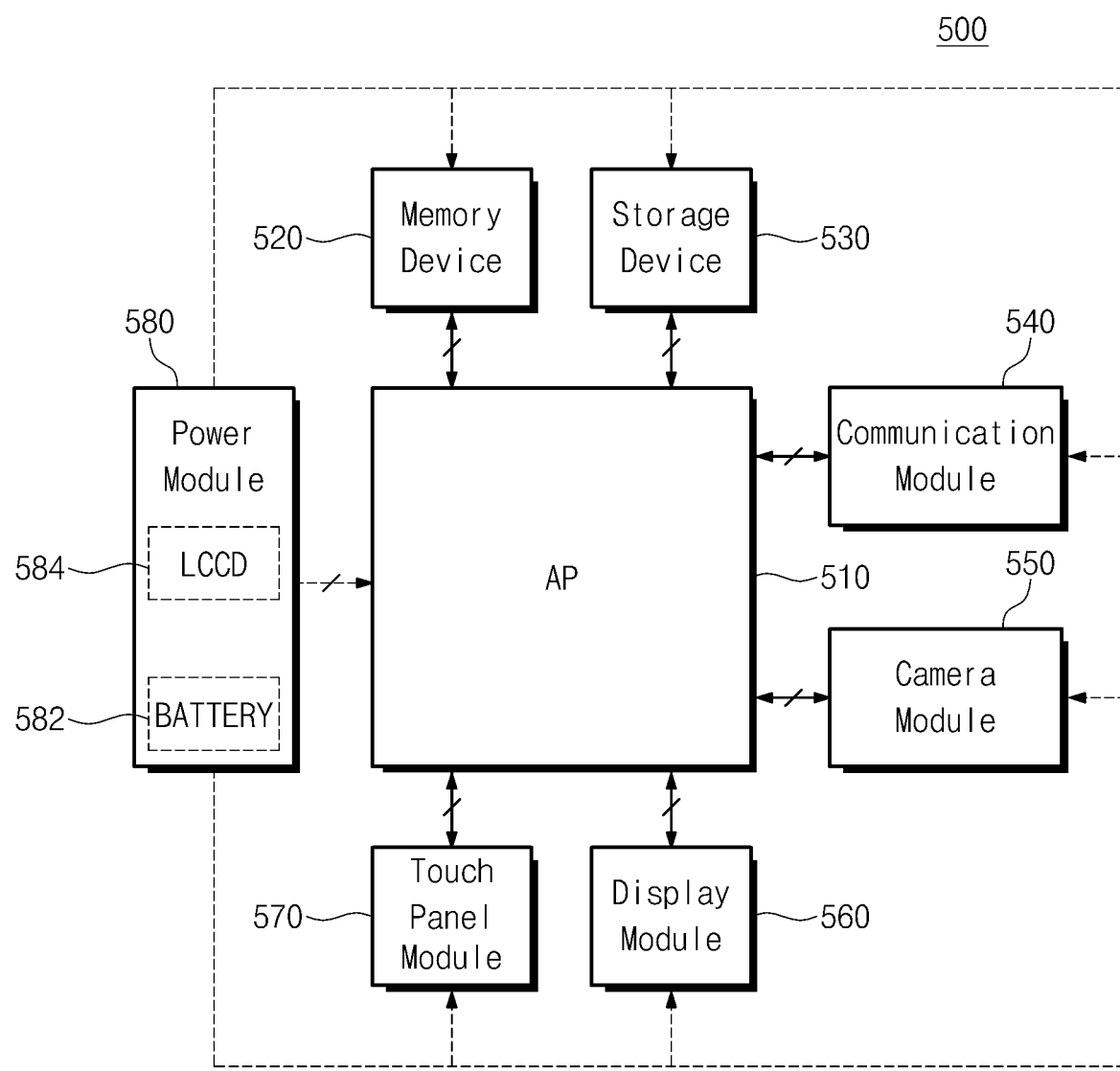
FIG. 16 is a block diagram schematically illustrating an application of the inventive concept applied to a handheld multimedia device, according to one embodiment of the inventive concept.

FIG. 16 is a block diagram schematically illustrating an application of certain aspects of the inventive concept applied to a handheld multimedia device.

Referring to FIG. 16, a handheld multimedia device includes an AP 510, a memory device 520, a storage device 530, a communication module 540, a camera module 550, a display module 560, a touch panel module 570, and a power module 580.

The AP 510 performs a data processing function.

In FIG. 16, the memory device 520 is implemented with a device such as described with reference to FIG. 1, thereby resulting in a decrease in production cost of the handheld multimedia device.

The communication module 540 connected to the AP 510 acts as a modem that is configured to perform a communication data transmitting and receiving function and a data modulating and demodulating function.

The storage device 530 includes a NOR or NAND flash memory to store mass information.

The display module 560 is implemented with a liquid crystal having a backlight, a liquid crystal having an LED light source, or a touch screen (e.g., OLED). The display module 560 may be an output device for displaying images (e.g., characters, numbers, pictures, etc.) in color.

The touch panel module 570 provides the AP 510 with a touch input solely or together with the display module 560.

There is described an embodiment in which the handheld multimedia device is a mobile communications device. In some cases, the handheld multimedia device may be used as a smart card by adding or removing components to or from the mobile device.

The handheld multimedia device may be connected with an external communication device through a separate interface. The external communication device may include the following: a DVD player, a computer, a set top box (STB), a game machine, and a digital camcorder.

The power module 580 performs power management of the mobile device. As a result, power saving of the handheld multimedia device may be achieved if a PMIC scheme is applied to a system-on-chip.

The camera module 550 includes a camera image processor (CIS) and is connected to the AP 510.

Although not shown in FIG. 16, the handheld multimedia device may further include another application chipset or a mobile DRAM.

Figure 17:
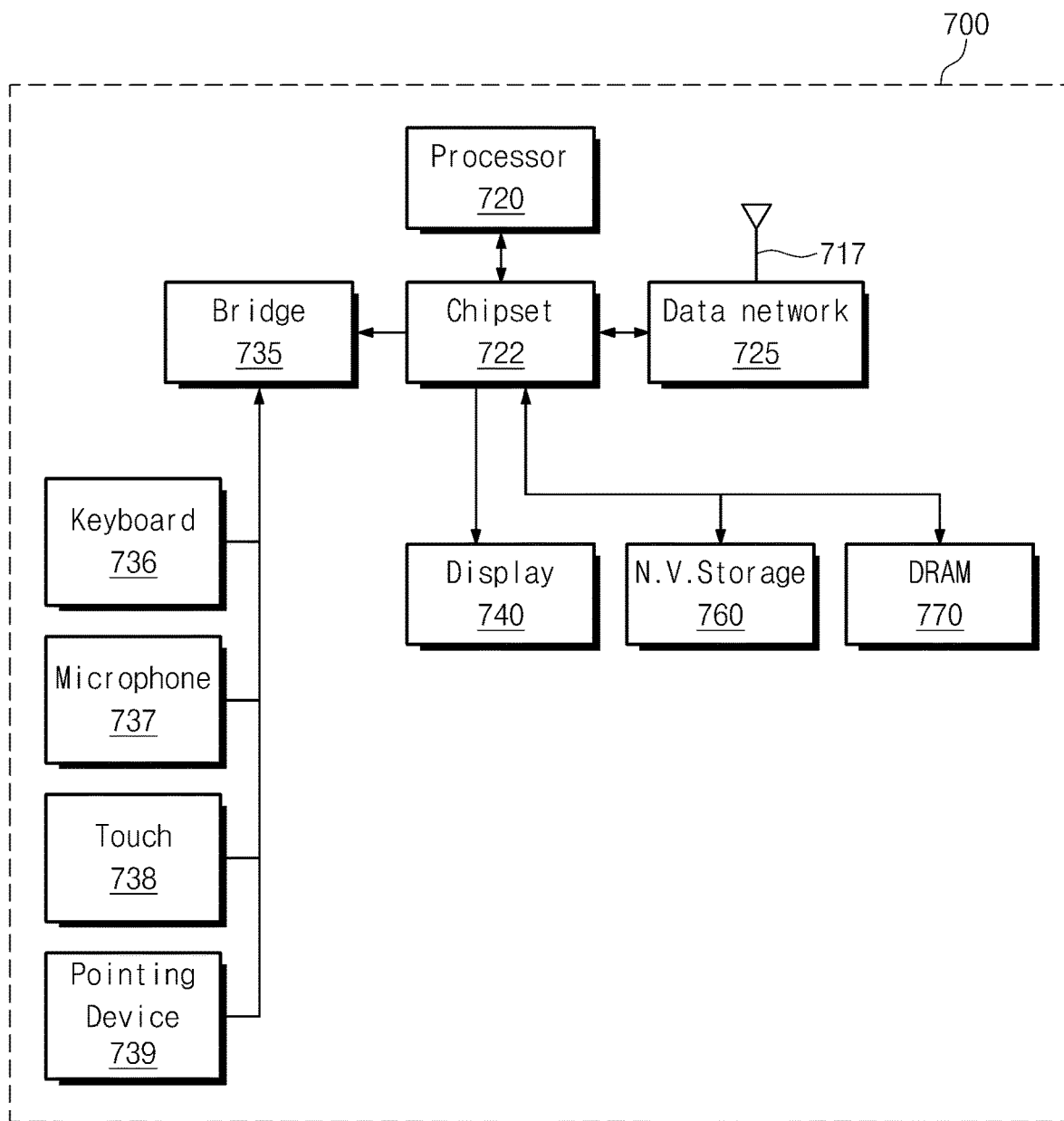
FIG. 17 is a block diagram schematically illustrating an application of the inventive concept applied to a personal computer, according to one embodiment of the inventive concept.

FIG. 17 is a block diagram schematically illustrating an application of the inventive concept applied to an electronic device such as a personal computer.

Referring to FIG. 17, a personal computer 700 includes a processor 720, a chipset 722, a data network 725, a bridge 735, a display 740, nonvolatile storage 760, a DRAM 770, a keyboard 736, a microphone 737, a touch unit 738, and a pointing device 739.

In FIG. 17, the DRAM 770 may be implemented with two or more dies as described with reference to FIG. 2. For example, first and second dies may be formed to have independent channels. The second die may be spaced apart from the first die such that the first and second die are contained in one package.

An interconnection part is formed between the first and second dies to transmit signals to counterpart dies. The first and second dies interconnected are contained in one package.

The chipset 722 provides the DRAM 770 with a command, an address, data, or any other control signals.

The processor 720 acts as a host and controls an overall operation of the personal computer 700.

A host interface between the processor 720 and the chipset 722 may include a variety of protocols for data communications.

The nonvolatile storage 760 may be formed of EEPROM (Electrically Erasable Programmable Read-Only Memory), flash memory, MRAM (Magnetic RAM), STT-MRAM (Spin-Transfer Torque MRAM), CBRAM (Conductive bridging RAM), FeRAM (Ferroelectric RAM), PRAM (Phase change RAM) called OUM (Ovonic Unified Memory), RRAM or ReRAM (Resistive RAM), nanotube RRAM, PoRAM (Polymer RAM), NFGM (Nano Floating Gate Memory), holographic memory, molecular electronics memory device), or insulator resistance change memory.

The personal computer device shown in FIG. 17 may be provided as one of various components of an electronic device, such as a computer, a ultra-mobile personal computer (UMPC), a workstation, a net-book, a personal digital assistance (PDA), a portable computer (PC), a web tablet, a wireless phone, a mobile phone, a smart phone, a smart television, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, storage as a data center, a device for transmitting and receiving information in a wireless environment, one of various electronic devices constituting a home network, one of various electronic devices constituting a computer network, one of various electronic devices constituting a telematics network, a radio frequency identification (RFID) device, or one of various components constituting a computing system.

Figure 18:
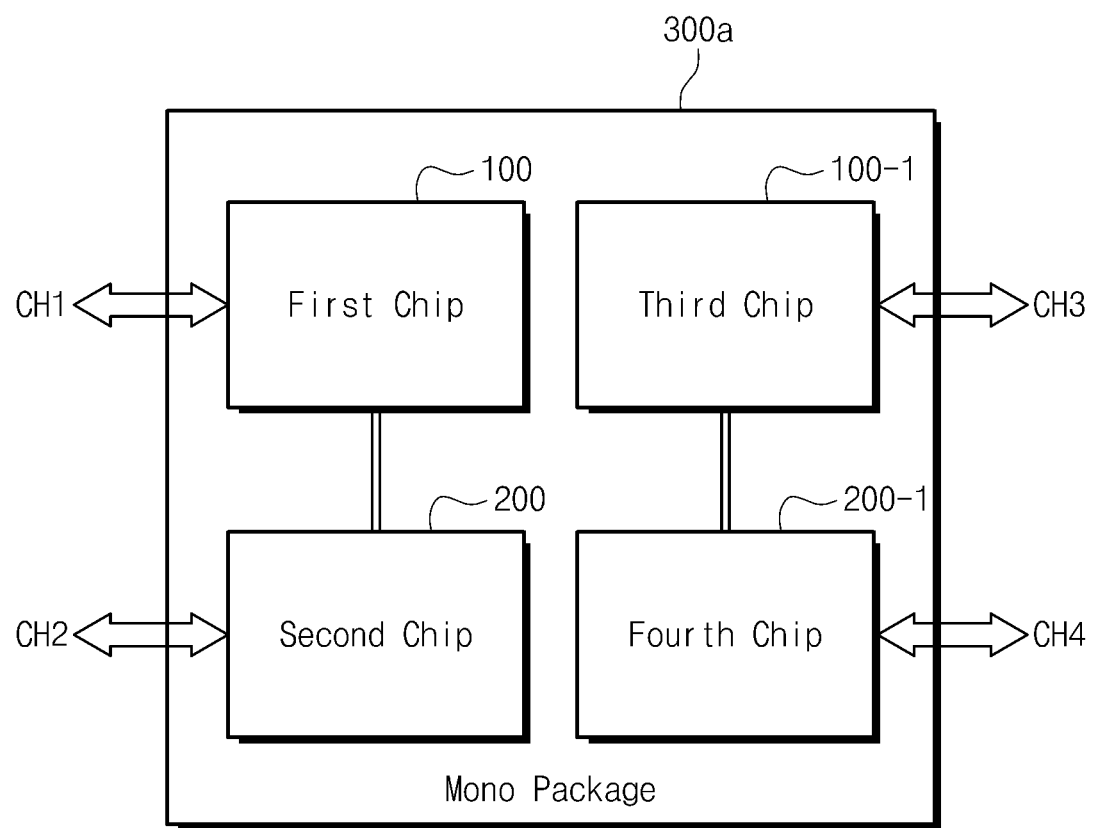
FIG. 18 is block diagram showing a modified embodiment of a semiconductor device shown in FIG. 1.

FIG. 18 is block diagram showing a modified embodiment of a semiconductor device shown in FIG. 1.

Referring to FIG. 18, a multi-channel semiconductor device 300a includes four chips 100, 200, 100-1, and 200-1 formed of four dies.

An interconnection is formed between a first chip 100 and a second chip 200, and an interconnection is formed between a third chip 100-1 and a fourth chip 200-1.

The multi-channel semiconductor device 300a includes four channels in a mono package.

The first chip 100 and the second chip 200 are formed of two dies, but they may perform the same data input/output operation as a 2-channel semiconductor memory device having the same memory size as the combined first chip 100 and second chip 200, but fabricated as a mono die.

The third chip 100-1 and the fourth chip 200-1 are formed of two dies, but they may perform the same data input/output operation as a 2-channel semiconductor memory device having the same memory size as the combined third chip 100-1 and fourth chip 200-1, but fabricated as a mono die.

Figure 19:
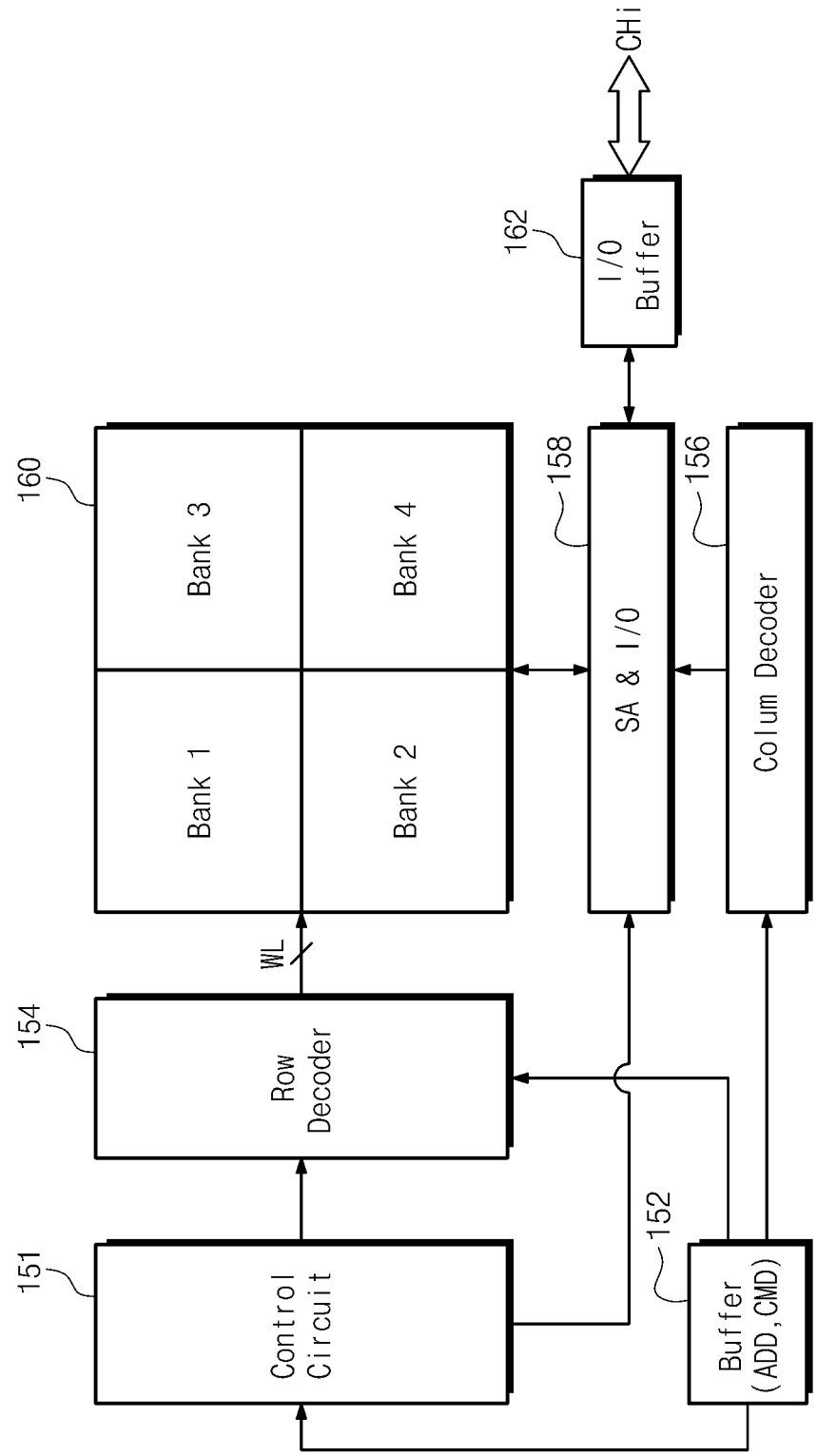
FIG. 19 is a block diagram schematically illustrating one of chips shown in FIG. 18, according to one embodiment of the inventive concept.

FIG. 19 is a block diagram schematically illustrating one of chips shown in FIG. 18.

A first chip 100, for example, has a circuit block configured as illustrated in FIG. 19.

The first chip 100 contains a memory cell array 160, a sense amplifier and input/output circuit 158, an input/output buffer 162, a buffer 152, a row decoder 154, a column decoder 156, and a control circuit 151.

The memory cell array 160 includes DRAM memory cells each having an access transistor and a storage capacitor. The memory cells are arranged in a matrix. In FIG. 19, an embodiment of the inventive concept is exemplified as the memory cell array 160 is divided into four banks. However, the inventive concept is not limited thereto. For example, the memory cell array 160 may be formed of one bank, two bank, or five or more banks.

The control circuit 151 generates an internal control signal for controlling set operating modes, in response to an input of a control signal and an address.

The buffer 152 receives and buffers an address. In response to the internal control signal, the buffer 152 provides a row address for selecting a row of the memory cell array 160 to the row decoder 154 and a column address for selecting a column of the memory cell array 160 to the column decoder 156.

The buffer 152 receives and buffers a command. The control circuit 151 decodes the command from the buffer 152.

The row decoder 154 decodes the row address in response to the internal control signal. The row decoder 154 selects and drives word lines connected with memory cells, depending on the decoded result.

The column decoder 17 decodes the column address in response to the internal control signal. Column gating is made depending on the decoded column address. Driven is a selected bit line of bit lines connected with memory cells as a result of the column gating.

The sense amplifier and input/output circuit 158 senses data stored at a selected memory cell by detecting a potential on a bit line of the selected memory cell.

The input/output buffer 162 buffers data that is output and input. At a read mode of operation, the input/output buffer 162 buffers data read out from the sense amplifier and input/output circuit 158 and outputs the buffered data to a channel CHi. The channel CHi may correspond to one of the first through fourth channels described in connection with FIGS. 1-9 and 18 above.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

For example, an embodiment of the inventive concept is exemplified as first and second dies are contained in one package. In some cases, a detailed implementation may be changed by modifying, adding, or deleting circuit components of figures without departing from the spirit and scope of the inventive concept. Also, the spirit and scope of the present invention may be described depending on a semiconductor device including a DRAM. However, the inventive concept is not limited thereto. For example, the inventive concept may be applied to other types of semiconductor memory devices.

What is claimed is:

1. A dynamic random access memory (DRAM) package for communicating with an external device through two independent channels, the DRAM package comprising:
   a package substrate;
   a first DRAM die configured to be connected to a first independent channel;
   a second DRAM die, identical to the first DRAM die in physical size and storage capacity, configured to be connected to a second independent channel; and
   an interconnection circuit configured to electrically connect the first and second DRAM dies for transmitting and receiving signals between the first and second DRAM dies,
   wherein the first and the second DRAM dies are disposed on horizontally separate areas of the package substrate and do not vertically overlap each other, and the first and the second DRAM die are packaged together in a package,
   wherein the first DRAM die includes a first swapping circuit configured to exchange input signals received from the first independent channel in response to a first swapping signal,
   wherein the input signals received from the first independent channel are address signals, and
   wherein the package is configured such that an impedance calibration signal is sent to the second DRAM die through the interconnection circuit when the impedance calibration signal is generated in the first DRAM die.

2. The DRAM package of claim 1, wherein the address signals include an address 0 signal, an address 1 signal, an address 2 signal, an address 3 signal, an address 4 signal, and an address 5 signal, and the first swapping circuit is further configured to swap the address 5 signal of the address signals for the address 0 signal of the address signals in response to the first swapping signal.

3. The DRAM package of claim 2, wherein the first swapping circuit is further configured to swap the address 4 signal of the address signals for the address 1 signal of the address signals in response to the first swapping signal.

4. The DRAM package of claim 3, wherein the first swapping circuit is configured to swap all of the address 5 through address 0 signals of the address signals in response to the first swapping signal.

5. The DRAM package of claim 4, wherein the interconnection circuit includes a wire bonding.

6. The DRAM package of claim 1, wherein the package is configured such that the second DRAM die includes a second swapping circuit configured to exchange input signals received from the second independent channel in response to a second swapping signal.

7. The DRAM package of claim 6, wherein the package is further configured such that the first swapping signal is enabled when the second swapping signal is disabled, and the first swapping signal is disabled when the second swapping signal is enabled.

8. The DRAM package of claim 1, wherein the DRAM package further includes a first pad set configured to be connected to the first independent channel and a second pad set configured to be connected to the second independent channel, and
   wherein the first pad set and the second pad set are located at a first edge and a second edge of the package substrate respectively in which the first edge and the second edge are opposite edges of the package substrate.

9. The DRAM package of claim 8, wherein the first DRAM die and the second DRAM die include a third pad set and a fourth pad set respectively, and
   wherein each pad of the third pad set is connected to a corresponding pad of the first pad set of the package substrate and each pad of the fourth pad set is connected to a corresponding pad of the second pad set of the package substrate.

10. The DRAM package of claim 9, wherein the first DRAM die and the second DRAM die further include a fifth pad set and a sixth pad set respectively, and
    wherein each pad of the fifth pad set is connected to a corresponding pad of the sixth pad set by the interconnection circuit.

11. The DRAM package of claim 10, wherein the first DRAM die is disposed in a position for the third pad set of the first DRAM die to be adjacent to the first edge of the package, and
    wherein the second DRAM die is disposed in a position for the fourth pad set of the second DRAM die to be adjacent to the second edge of the package substrate.

12. The DRAM package of claim 11, wherein the first DRAM die and the second DRAM die disposed on the package substrate are identical in configuration, and
    wherein the second DRAM die is rotated by one hundred eighty degrees relative to the first DRAM die.

13. A dynamic random access memory (DRAM) package for communicating with an external device through two independent channels, the DRAM package comprising:
    a package substrate;
    a first DRAM die configured to be connected to a first independent channel;
    a second DRAM die, identical to the first DRAM die in physical size and storage capacity, configured to be connected to a second independent channel; and
    an interconnection circuit configured to electrically connect the first and second DRAM dies for transmitting and receiving signals between the first and second DRAM dies,
    wherein the first and the second DRAM dies are packaged together in a package,
    wherein the first DRAM die includes a first swapping circuit configured to exchange input signals received from the first independent channel in response to a first swapping signal,
    wherein the input signals received from the first independent channel are address signals, and
    wherein the package is configured such that an impedance calibration signal is sent to the second DRAM die through the interconnection circuit when the impedance calibration signal is generated in the first DRAM die.

14. The DRAM package of claim 13, wherein the address signals include an address 0 signal, an address 1 signal, an address 2 signal, an address 3 signal, an address 4 signal, and an address 5 signal, and the first swapping circuit is further configured to swap the address 5 signal of the address signals for the address 0 signal of the address signals in response to the first swapping signal.

15. The DRAM package of claim 14, wherein the first swapping circuit is further configured to swap the address 4 signal of the address signals for the address 1 signal of the address signals in response to the first swapping signal.

16. The DRAM package of claim 15, wherein the first swapping circuit is configured to swap all of the address 5 through address 0 signals of the address signals in response to the first swapping signal.

17. The DRAM package of claim 13, wherein the package is configured such that the second DRAM die includes a second swapping circuit configured to exchange input signals received from the second independent channel in response to a second swapping signal.

18. The DRAM package of claim 17, wherein the package is further configured such that the first swapping signal is enabled when the second swapping signal is disabled, and the first swapping signal is disabled when the second swapping signal is enabled.

19. A dynamic random access memory (DRAM) package for communicating with an external device through two independent channels, the DRAM package comprising:
   a package substrate;
   a first DRAM die configured to be connected to a first independent channel;
   a second DRAM die, identical to the first DRAM die in physical size and storage capacity, configured to be connected to a second independent channel; and
   an interconnection circuit configured to electrically connect the first and second DRAM dies for transmitting and receiving signals between the first and second DRAM dies,
   wherein the first and the second DRAM dies are packaged together in a package,
   wherein the first DRAM die includes a first swapping circuit configured to exchange input signals received from the first independent channel in response to a first swapping signal, and
   wherein the package is configured such that an impedance calibration signal is sent to the second DRAM die through the interconnection circuit when the impedance calibration signal is generated in the first DRAM die.

20. The DRAM package of claim 19, wherein the input signals include an address 0 signal, an address 1 signal, an address 2 signal, an address 3 signal, an address 4 signal, and an address 5 signal, and the first swapping circuit is further configured to swap the address 5 signal of the input signals for the address 0 signal of the input signals in response to the first swapping signal.

* * * * *